US011181762B2

(12) United States Patent
Jeon et al.

(10) Patent No.: US 11,181,762 B2
(45) Date of Patent: Nov. 23, 2021

(54) DISPLAY DEVICE

(71) Applicant: Samsung Display Co., Ltd., Yongin-si (KR)

(72) Inventors: Jae Hwan Jeon, Seongnam-si (KR); Ji Sang Seo, Gwangju (KR); Dong Hyun Won, Suwon-si (KR); Wang Su Hong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 16/821,719

(22) Filed: Mar. 17, 2020

(65) Prior Publication Data

US 2020/0333655 A1 Oct. 22, 2020

(30) Foreign Application Priority Data

Apr. 17, 2019 (KR) .......................... 10-2019-0045036

(51) Int. Cl.
| | |
|---|---|
| *G02F 1/1333* | (2006.01) |
| *G02F 1/1345* | (2006.01) |
| *G02F 1/1339* | (2006.01) |
| *G02F 1/1362* | (2006.01) |
| *H01L 27/32* | (2006.01) |
| *H01L 51/52* | (2006.01) |

(52) U.S. Cl.
CPC .... *G02F 1/133308* (2013.01); *G02F 1/13336* (2013.01); *G02F 1/13452* (2013.01); *G02F 1/133314* (2021.01); *G02F 1/133317* (2021.01); *G02F 1/13394* (2013.01); *G02F 1/13398* (2021.01); *G02F 1/136286* (2013.01); *H01L 27/3276* (2013.01); *H01L 27/3293* (2013.01); *H01L 51/5253* (2013.01)

(58) Field of Classification Search
CPC ........... G02F 1/13336; G02F 1/133308; G02F 1/13452; G02F 1/133314; G02F 1/13317
See application file for complete search history.

(56) References Cited

U.S. PATENT DOCUMENTS

| | | | | |
|---|---|---|---|---|
| 5,106,197 A | * | 4/1992 | Ohuchida | ................. G09F 9/35 349/122 |
| 7,839,396 B2 | * | 11/2010 | Yang | .................. H05K 7/20963 345/204 |
| 9,036,124 B2 | * | 5/2015 | Jo | .......................... G02F 1/1345 349/149 |

(Continued)

FOREIGN PATENT DOCUMENTS

| | | |
|---|---|---|
| KR | 10-2011-0110549 A | 10/2011 |
| KR | 10-2013-0035120 A | 4/2013 |

(Continued)

*Primary Examiner* — Dung T Nguyen
(74) *Attorney, Agent, or Firm* — Lewis Roca Rothgerber Christie LLP

(57) ABSTRACT

A display device includes: a first substrate having a first area; a second substrate having a second area larger than the first area and positioned above the first substrate; interconnects on the first substrate; connection pads on a side surface of the first substrate and electrically connected to the interconnects; and a first cover member on the side surface of the first substrate, wherein a side surface of the second substrate protrudes from the side surface of the first substrate in a first direction, and the first cover member is located under the second substrate.

20 Claims, 33 Drawing Sheets

(56) References Cited

U.S. PATENT DOCUMENTS

2017/0293176 A1 10/2017 Bae
2018/0088388 A1 3/2018 Furuta
2019/0094456 A1* 3/2019 Lee ..................... G02B 6/0088

FOREIGN PATENT DOCUMENTS

| KR | 10-2013-0065254 A | 6/2013 |
| KR | 10-2017-0015621 A | 2/2017 |
| KR | 10-2017-0139217 A | 12/2017 |

* cited by examiner

1_3

1_6

DISPLAY DEVICE

CROSS-REFERENCE TO RELATED APPLICATION

This application claims priority to and the benefit of Korean Patent Application No. 10-2019-0045036 filed on Apr. 17, 2019 in the Korean Intellectual Property Office, the disclosure of which is incorporated herein by reference in its entirety.

BACKGROUND

1. Field

Aspects of some example embodiments of the present disclosure relate to a display device.

2. Description of the Related Art

Display devices become more and more important as multimedia technology evolves. Accordingly, a variety of display devices such as liquid-crystal display (LCD) devices and organic light-emitting diode display (OLED) devices are currently being developed.

There is a region where a drive IC or other printed circuits are located on the outer periphery of the glass substrate of a display device. This region may be referred to as a bezel which is a non-display area where no image is displayed. For a tiled display apparatus in which a number of display devices are arranged in a lattice or matrix pattern to form a large screen, the display devices are connected with one another. Therefore, non-display areas are formed where two bezels of adjacent display devices are positioned together. Such non-display areas are recognized by a viewer and thus deteriorate the quality of the displayed images.

The above information disclosed in this Background section is only for enhancement of understanding of the background and therefore the information discussed in this Background section does not necessarily constitute prior art.

SUMMARY

Aspects of some example embodiments of the present disclosure provide a display device with the reduced bezel.

It should be noted that aspects of embodiments of the present disclosure are not limited to the above-mentioned characteristics; and other aspects of the present invention will be more apparent to those skilled in the art from the following descriptions.

According to some example embodiments of the present disclosure, it may be possible to effectively reduce the bezel. Moreover, it may be possible to improve buffer effect by using cover members.

It should be noted that aspects of the present disclosure are not limited to those described above and other aspects of the present disclosure will be more apparent to those skilled in the art from the following descriptions.

According to some example embodiments of the present disclosure, a display device includes: a first substrate having a first area, a second substrate having a second area larger than the first area and above the first substrate, interconnects on the first substrate, connection pads on a side surface of the first substrate and electrically connected to the interconnects, and a first cover member on the side surface of the first substrate, wherein a side surface of the second substrate protrudes from the side surface of the first substrate in a first direction, and the first cover member is located under the second substrate.

According to some example embodiments, the first cover member may comprise: a first portion extended in a second direction intersecting with the first direction; and a second portion extended in the first direction from an upper end of the first cover member, wherein the second portion is fixed to the second substrate.

According to some example embodiments, the first cover member may comprise: a first portion extended in a second direction intersecting with the first direction; and a second portion extended in an opposite direction to the first direction from an upper end of the first cover member, wherein the second portion is fixed to the second substrate.

According to some example embodiments, the second substrate may comprise: a first region overlapping the first substrate in a second direction intersecting with the first direction; and a second region not overlapping the first substrate in the second direction, and wherein an accommodating groove is formed in the second region so that an upper end of the first cover member is inserted into the accommodating groove.

According to some example embodiments, the first cover member may comprise: a first vertical portion extended in a second direction intersecting with the first direction; a first protruding portion protruding in the first direction; and a first depressed portion protruding in an opposite direction to the first direction, wherein an end of the first vertical portion is fixed to the second substrate.

According to some example embodiments, the display device may further comprise: a second cover member on another side surface of the first substrate and under the second substrate, wherein the second cover member comprises a second vertical portion extended in a second direction intersecting with the first direction, a second protruding portion protruding in an opposite direction to the first direction, and a second depressed portion protruding in the first direction, and wherein an end of the first vertical portion is fixed to the second substrate.

According to some example embodiments, the first protruding portion may be aligned with the second depressed portion in the first direction, and the first depressed portion is aligned with the second protruding portion in the first direction.

According to some example embodiments, the display device may further comprise: a bottom cover under the first substrate and comprising a bottom, a first sidewall and a second sidewall, wherein an upper end of the first cover member is fixed to a lower surface of the second substrate, and a lower end of the first cover member is fixed to the first sidewall.

According to some example embodiments, the display device further comprise: a second cover member on another side surface of the first substrate and under the second substrate, wherein an upper end of the second cover member is fixed to the lower surface of the second substrate and a lower end of the second cover member is fixed to the second sidewall, and wherein a length of the first sidewall is different from a length of the second sidewall in a second direction intersecting with the first direction.

According to some example embodiments, the first substrate may be a color filter substrate, and the second substrate is a TFT substrate, and wherein the display device further comprises: a first spacer between the first substrate and the second substrate, and a second spacer between the first spacer and the first substrate.

According to some example embodiments, a side surface of the first spacer may be aligned with the side surface of the second substrate, and a side surface of the second spacer is aligned with the side surface of the first substrate.

According to some example embodiments, the first spacer may comprise a blue colorant.

According to some example embodiments, the side surface of the second substrate may protrude from the side surface of the first substrate by a distance of 0.3 to 0.5 mm.

According to some example embodiments of the present disclosure, a display device includes: a display panel comprising a first substrate and a second substrate, each of the first substrate and the second substrate having first to fourth side surfaces, and first to fourth cover members on the first to fourth side surfaces, respectively, wherein the display panel comprises interconnects on the first substrate, and connection pads on the first side surface of the first substrate and electrically connected to the interconnects, wherein the first side surface of the second substrate protrudes from the first side surface of the first substrate, and the first cover member is on the first side surface and under the second substrate and is spaced apart from the connection pads.

According to some example embodiments, the second to fourth side surfaces of each of the first substrate and the second substrate may be aligned with one another in a second direction intersecting with the first direction, wherein the second cover member is on the second side surface of each of the first substrate and the second substrate, wherein the third cover member is on the third side surface of each of the first substrate and the second substrate, and wherein the fourth cover member is on the fourth side surface of each of the first substrate and the second substrate.

According to some example embodiments, the second side surface of the second substrate opposed to the first side surface of the second substrate may protrude from the first side surface of the first substrate in an opposite direction to the first direction, and wherein the second cover member is on the second side surface of the first substrate and under the second substrate.

According to some example embodiments, the third side surface of the second substrate connecting the first side surface with the second side surface of the second substrate may protrude from the third side surface of the first substrate in a second direction intersecting with the first direction, and wherein the third cover member is on the third side surface of the first substrate and under the second substrate.

According to some example embodiments, the fourth side surface of the second substrate opposed to the third side surface of the second substrate may protrude from the fourth side surface of the first substrate in an opposite direction to the second direction, and wherein the fourth cover member is on the fourth side surface of the first substrate and under the second substrate.

According to some example embodiments, a side surface of the first cover member may be aligned with the first side surface of the second substrate.

According to some example embodiments, at least one of the first cover member, the second cover member, the third cover member and the fourth cover member may overlap the second substrate in a second direction intersecting the first direction.

BRIEF DESCRIPTION OF THE DRAWINGS

The above and other aspects and features of the present disclosure will become more apparent by describing in detail aspects of some example embodiments thereof with reference to the attached drawings, in which.

DETAILED DESCRIPTION

Aspects of some example embodiments of the present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be more thorough and more complete, and will more fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

Hereinafter, aspects of some example embodiments of the present disclosure will be described with reference to the accompanying drawings.

Figure 1:
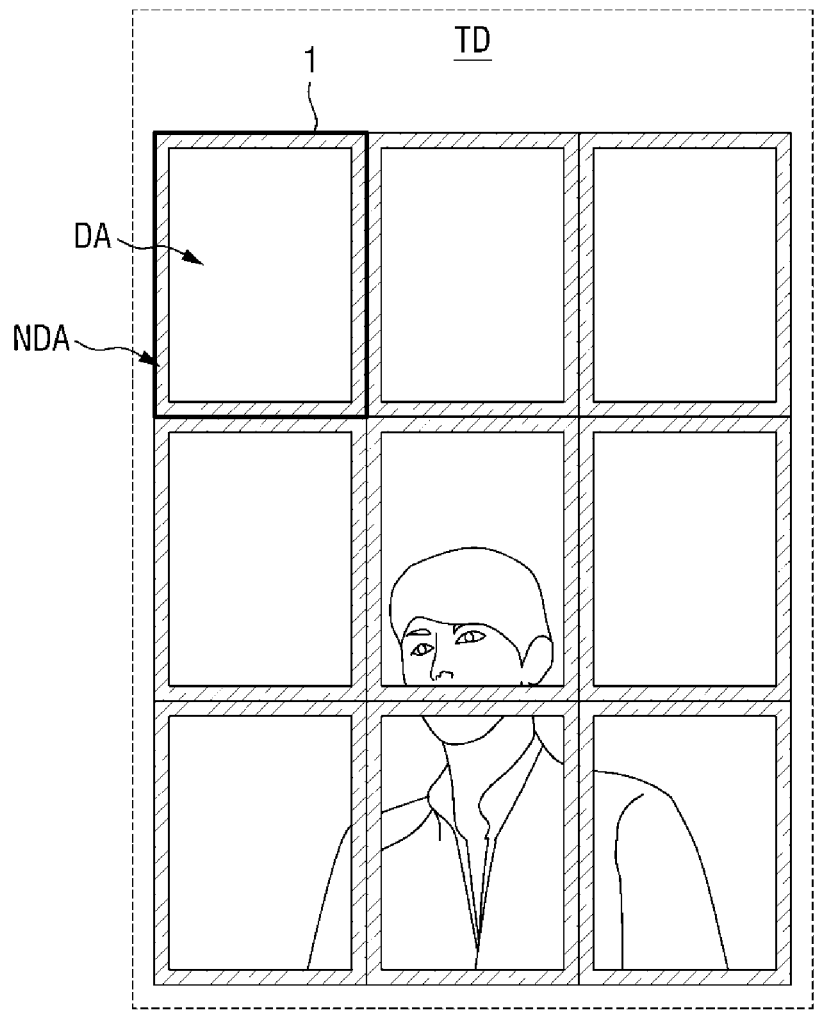
FIG. 1 is a view showing a tiled display device according to some example embodiments.
Figure 2:
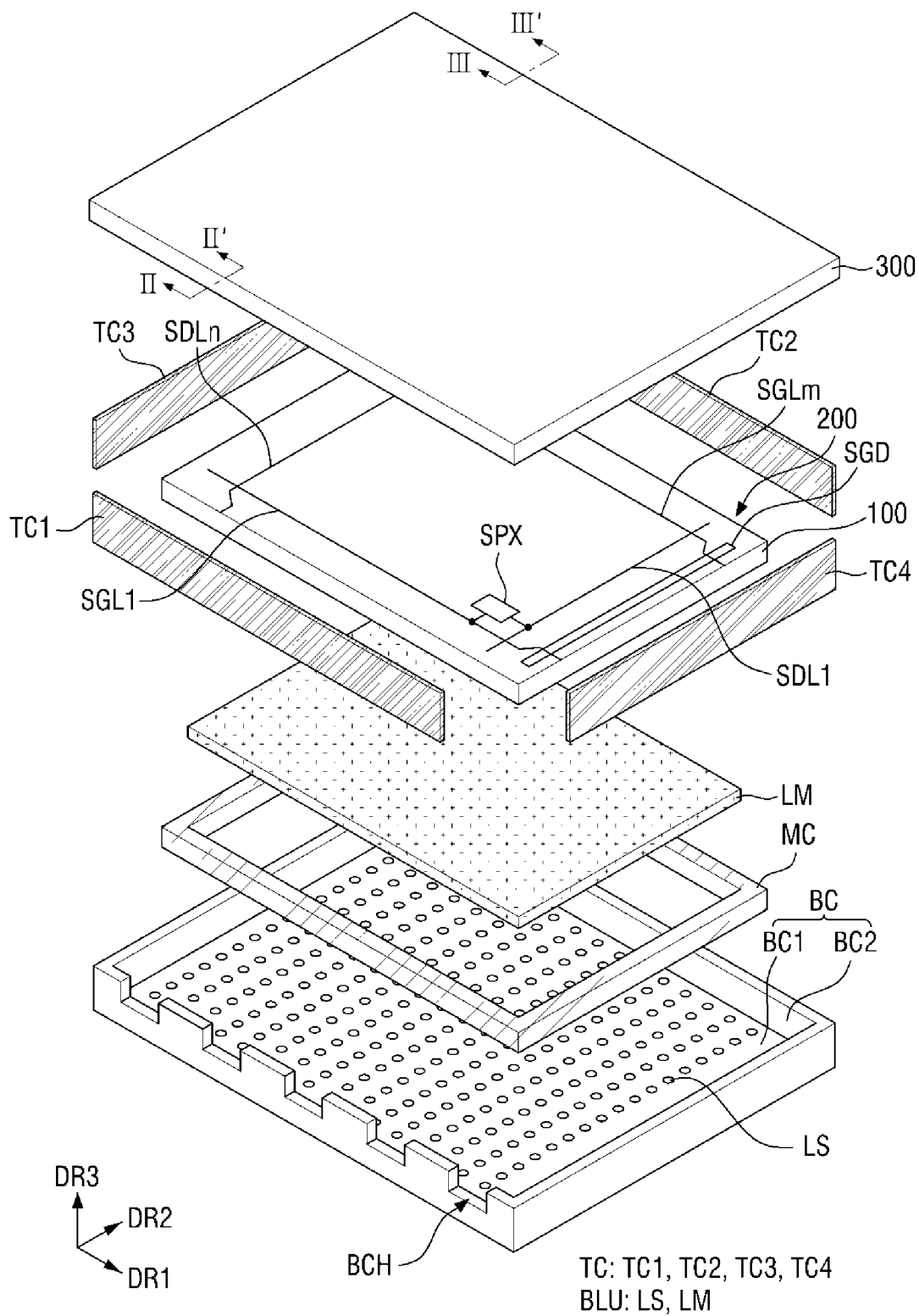
FIG. 2 is an exploded perspective view schematically showing the display device of FIG. 1.
Figure 3:
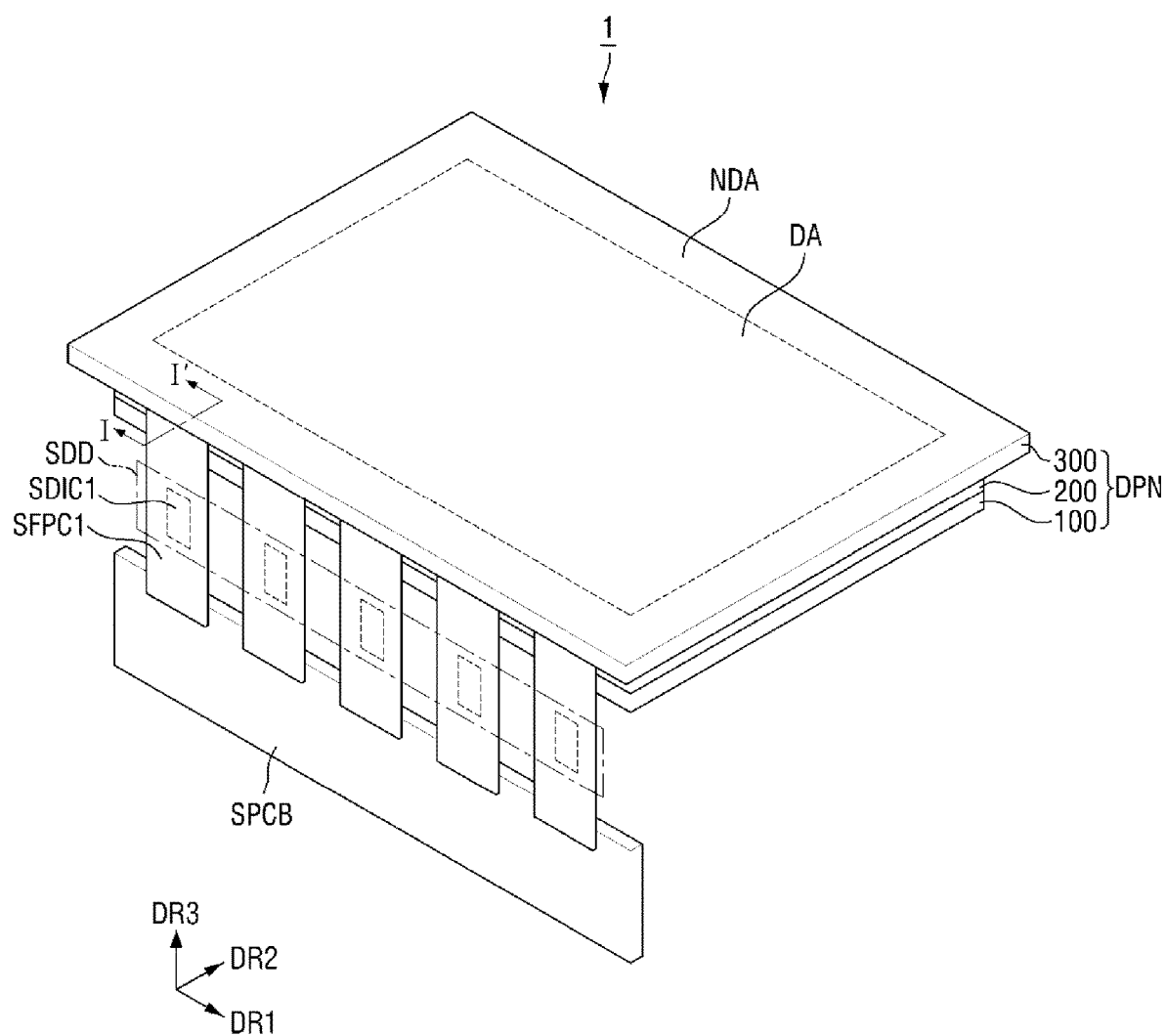
FIG. 3 is a perspective view schematically showing a display panel and printed circuit boards coupled with it according to some example embodiments of the present disclosure.
Figure 4:
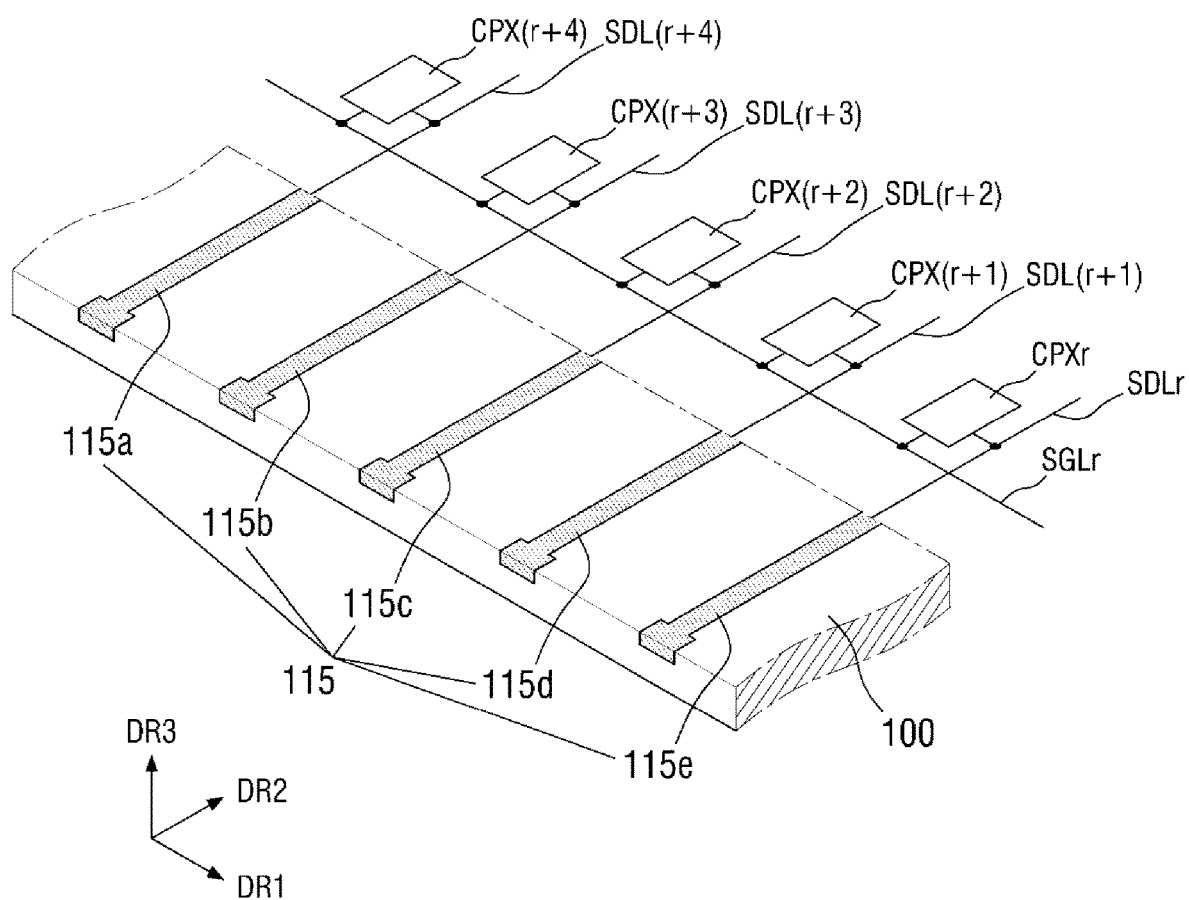
FIG. 4 is a view for illustrating interconnects of a display device according to some example embodiments of the present disclosure.
Figure 5:
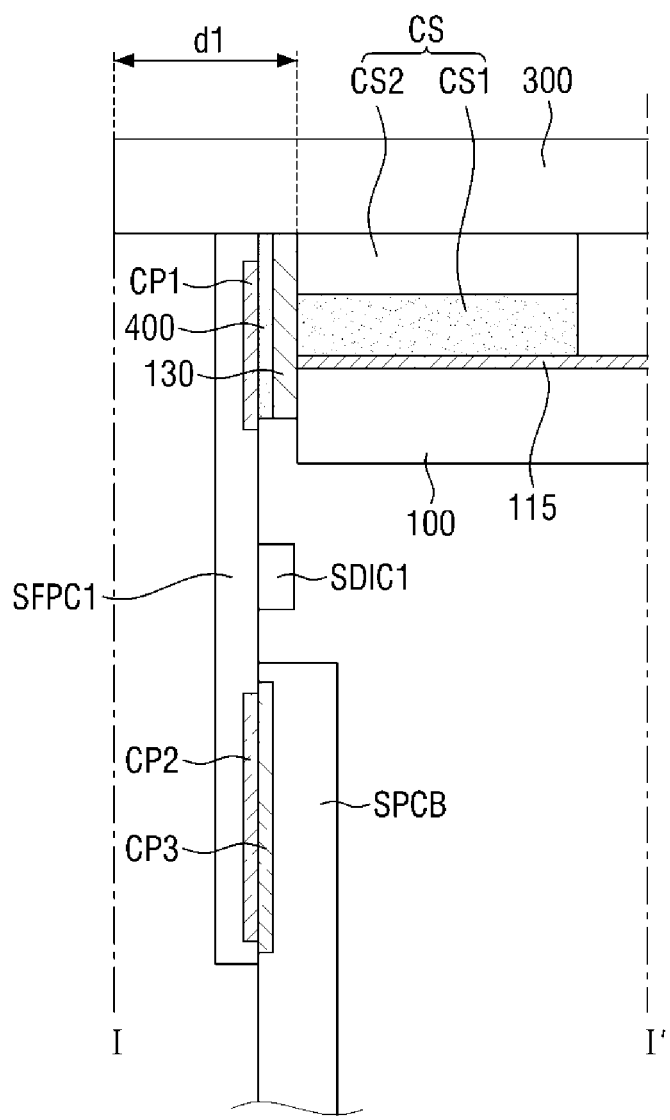
FIG. 5 is a cross-sectional view taken along the line I-I' of FIG. 3.

FIG. 1 is a view showing a tiled display apparatus. FIG. 2 is an exploded perspective view schematically showing the display device of FIG. 1. FIG. 3 is a perspective view schematically showing a display panel and printed circuit boards coupled with it according to some example embodiments of the present disclosure. FIG. 4 is a view for illustrating interconnects of a display device according to some example embodiments of the present disclosure. FIG. 5 is a cross-sectional view taken along the line I-I' of FIG. 3.

As used herein, "above" and "upper surface" in the thickness direction refers to the side of the display device 1 on which images are displayed or the side indicated by the arrow of in the third direction DR3, whereas "below" and "lower surface" refers to the opposite side of the display device 1 or the opposite side in the third direction DR3, unless stated otherwise. In addition, "upper side," "lower side," "left side" and "right side" in the plane are defined when the display surface is viewed from the top. For example, the "left side" refers to the opposite side indicated by the arrow of the second direction DR2, the "right side" refers to the side indicated by the arrow of the second direction DR2, the "upper side" refers to the side indicated by the arrow of the first direction DR1, and the "lower side" refers to the side indicated by the arrow of the first direction DR1.

The display device 1 may be a self-luminous display device such as an organic light-emitting display device, a quantum-dot light-emitting display device, a micro LED display device and a nano LED display device. Alternatively, the display device 1 may be a non-self-luminous display device such as an electrophoretic display device and an electrowetting display device. In the following description, a liquid-crystal display device including a liquid-crystal layer is described as an example of the display device 1 for convenience of illustration.

In some example embodiments, the display device 1 may be used in a large electronic device such as a television and an electric board, as well as in a small and medium electronic device such as a personal computer, a laptop computer, a vehicle navigation device and a camera, etc. In addition, the display device may be used in a tablet PC, a smart phone, a personal digital assistant (PDA), a portable multimedia player (PMP), a game device, a wristwatch type electronic device, etc. The above-listed electronic devices are merely illustrative and the display device may be employed by other display devices.

Referring to FIG. 1, a tiled display apparatus TD may include a plurality of display devices 1. According to some example embodiments, the plurality of display devices 1 may be arranged in a lattice pattern, but the present disclosure is not limited thereto. The display devices 1 may be connected in the first direction DR1 or in the second direction DR2 or may be connected in a particular pattern. The display devices 1 may have the same size, but the present disclosure is not limited thereto. The display devices 1 may have different sizes.

According to some example embodiments, the plurality of display devices 1 included in the tiled display apparatus TD may have a rectangular shape including longer sides and shorter sides. The longer sides or the shorter sides of each of the plurality of display devices 1 may be connected to the longer sides or the shorter sides of adjacent ones of the display devices. Some of the display devices 1 may form a side of the tiled device apparatus TD, some of the display devices 1 may be located at a corner of the tiled display apparatus TD to form two adjacent sides, and some of the display devices 1 may be located on the inner side of the tiled device apparatus TD and surrounded by others of the display devices 1.

Each of the display devices 1 may include a display area DA and a non-display area NDA. The display area DA is where images are displayed. The non-display area NDA is where no image is displayed, i.e., the bezel of the display device 1 and may be located around the display area NDA. The non-display area NDA may surround the display area DA, but the present disclosure is not limited thereto. Different display devices 1 may have non-display areas NDA of different shapes depending on their positions. Alternatively, the display devices 1 may have non-display area NDA of the same shape.

The tiled display apparatus TD may have a generally planar shape, but the present disclosure is not limited thereto. The tiled display apparatus TD may have a three-dimensional shape to give a three-dimensional effect. When the tiled display apparatus TD has a three-dimensional shape, each of the display devices 1 included in the tiled display apparatus TD may have a curved shape, and may be connected to one another in a planar shape or at a predetermined angle, such that the tiled display apparatus TD may be formed in three-dimensional shape.

The bezels of the plurality of display devices 1, which are defined as the non-display areas NDA, may be connected with one another directly. Alternatively, they may be connected with one another by a connecting member. As such, because the display devices 1 are connected with one another in the tiled display apparatus TD, two bezels of the adjacent display devices 1 are positioned together at the connection portions. Therefore, each of the display devices 1 is required to have a thin bezel. To this end, it is contemplated that a connection pad of a flexible circuit board is connected to the side surface of each of the display devices 1. A more detailed description thereon will be made below.

Hereinafter, example embodiments of the display device 1 will be described in detail, which may be employed as one of the display devices 1 of the tiled display apparatus TD or may be used alone.

Referring to FIGS. 2 to 5, each of the display devices 1 may include a display panel DPN, a backlight unit BLU under the display panel DPN, a bottom cover BC that accommodates and fixing the display panel DPN and the backlight unit BLU, a middle frame MC, and cover members TC.

The display panel DPN may include a first substrate 100, a liquid-crystal layer 200, and a second substrate 300. According to some example embodiments, the display panel DPN may further include a source flexible circuit board SFPC1 attached to one side surface of the display panel DPN, and a printed circuit board SPCB connected to the source flexible circuit board SFPC1 as shown in FIG. 3.

Each of the first substrate 100 and the second substrate 300 may have a rectangular shape that has longer sides in the first direction DR1 and shorter sides in the second direction DR2 perpendicular to the first direction DR1. It is, however, to be understood that the shapes of the first substrate 100 and the second substrate 300 are not limited thereto. The first display substrate 100 and the second display substrate 300 may have curved portions in some implementations.

The display panel DPN may include the display area DA where images are displayed, and the non-display area NDA where no image is displayed. The display area DA and the non-display area NDA of the display panel DPN may be in line with the display area DA and the non-display area NDA of the display device 1, respectively. According to some example embodiments, the display device 1 may further include a window member on the second substrate 300, which covers the display panel DPN and transmits images to the outside.

The first substrate 100 and the second substrate 300 may have different areas. For example, the area of the first substrate 100 may be smaller than the area of the second substrate 300. The areas of the first substrate and the second substrate will be discussed in more detail below.

The first substrate 100 may include a plurality of pixels SPX. According to some example embodiments, the plurality of pixels SPX may be arranged in a matrix. It is, however, to be understood that the present disclosure is not limited thereto. A plurality of gate lines SGL1 to SGLm and a plurality of data lines SDL1 to SDLn may be located along the boundaries of the pixels SPX, where m and n are natural numbers. The gate lines SGL1 to SGLm may serve as selection line L for selecting among the plurality of pixels SPX.

Although only one pixel SPX is depicted in FIG. 2 for convenience of illustration, it is to be understood that a plurality of pixels SPX may be defined on the first substrate 100 in practice. In each of the pixels SPX, a pixel electrode defining the pixel may be positioned.

The gate lines SGL1 to SGLm and the data lines SDL1 to SDLn may be insulated from one another and intersect with one another. The gate lines SGL1 to SGLm may be extended in the first direction DR1 and may be electrically connected to a gate driver SGD. The data lines SDL1 to SDLn may be extended in the second direction DR2 and may be connected to a data driver SDD as shown in FIG. 3.

The pixels SPX may be electrically connected to the gate lines SGL1 to SGLm and the data lines SDL1 to SDLn intersecting with each other. The pixels SPX may be arranged, but is not limited to being, in a matrix.

The gate driver SGD may be positioned at a predetermined location adjacent to at least one of the shorter sides of the first substrate 100, for example. It is, however, to be understood that the location of the gate driver SGD is not limited thereto.

For example, the gate driver SGD may be formed during a process of fabricating transistors for driving the pixels SPX and may be mounted on the first substrate 100 in the form of an amorphous silicon TFT gate driver circuit (ASG) or an oxide silicon TFT gate driver circuit (OSG).

It is, however, to be understood that the present disclosure is not limited thereto. In some implementations, the gate driver SGD may be formed of a plurality of driver chips, may be mounted on a flexible driving circuit board, and may be mounted on the first substrate 100 by using tape carrier package (TCP) technique. The gate driver SGD may be formed of a plurality of driver chips and may be mounted on the first substrate 100 by using chip-on-glass (COG) technique.

As shown in FIG. 3, the data driver SDD may include source driver chips SDIC1. The data driver SDD may include a single driver chip SDIC1 or more than one driver chips SDIC1. Although five source driver chips SDIC1 are positioned in the example shown in FIG. 3, the number of the source driver chips is not limited thereto.

The driving printed circuit board SPCB1 may include, for example, a timing controller. The timing controller may be mounted on the driving printed circuit board SPCB1 in the form of an integrated circuit chip and electrically connected to the gate driver SGD and the data driver SDD. The timing controller may output a gate control signal, a data control signal, and image data.

The gate driver SGD may receive the gate control signal from the timing controller. The gate driver SGD may generate gate signals in response to the gate control signal and sequentially output the generated gate signals. The gate signals may be applied to the pixels via gate lines SGL1 to SGLm row by row. As a result, the pixels SPX can be driven row by row.

The data driver SDD may receive image data and the data control signal from the timing controller. The data driver SDD may generate analog data voltages corresponding to the image data in response to the data control signal, to output them. The data voltages may be provided to the pixels SPX through the data lines SDL1 to SDLn.

The pixels SPX may receive data voltages through the data lines SDL1 to SDLn in response to the gate signals provided through the gate lines SGL1 to SGLm. The pixels SPX may display grayscale corresponding to the data voltages, thereby controlling the transmittance of the region in which each pixel SPX is positioned.

Although the flexible circuit boards SFPC1 are connected to the longer side of the first substrate 100 in the example shown in the drawings, the example embodiments of the present disclosure are not limited thereto. The positions where the first substrate 100 and the flexible circuit boards SFPC1 are connected may vary as desired. For example, the flexible circuit boards SFPC1 may be positioned adjacent to the shorter side of the first substrate 100. In addition, the flexible circuit boards SFPC1 may be positioned adjacent to both the longer sides of the first substrate 100. In addition, the flexible circuit boards SFPC1 may be positioned on both of the shorter sides of the first substrate 100 or may be positioned on the longer sides and the shorter sides.

Each of the flexible circuit boards SFPC1 may include a first contact pad CP1 as shown in FIG. 5. Each of the source driver chips SDIC1 may be electrically connected to the first contact pad CP1 of the respective one of the flexible circuit boards SFPC1. The first contact pad CP1 of each of the flexible circuit boards SFCP1 may be electrically connected to a connection pad 130 positioned on the side surface of the first substrate 100 through an adhesive film 400.

As shown in FIG. 4, interconnects 115 may be positioned on the first substrate 100. One ends of the interconnects 115a, 115b, 115c, 115d and 115e may be electrically connected to a plurality of data lines SDLr to SDL(r+4), respectively, where r is a natural number, as shown in the drawing. The other ends of the interconnects 115a, 115b, 115c, 115d, and 115e may be connected to the connection pads 130, respectively, as shown in FIG. 5. Accordingly, the connection pads 130 may be electrically connected to the plurality of data lines SDLr to SDL(r+4), respectively.

The gate line SGLr may intersect the plurality of data lines SDLr to SDL(r+4). The plurality of pixels CPXr to CPX(r+4) may be electrically connected to the gate line SGLr.

Although only five interconnects 115a, 115b, 115c, 115d and 115e are shown in the drawing, this is for the sake of understanding. In practice, the number of the interconnects 115a, 115b, 115c, 115d and 115e electrically connected to the data lines SDLr to SDL(r+4) may be larger than or less than five.

Although the interconnects 115 are electrically connected to the data lines SDLr to SDL(r+4) in the foregoing description, the example embodiments of the present disclosure are not limited thereto. According to a modification of the present disclosure, the interconnects 115 and the connection pads 130 may be arranged in a similar manner and may be connected to a plurality of gate lines SGL1 to SGLm (see FIG. 2) or other lines of the first substrate 100. Hereinafter, the electrical connection of the data lines SDLr to SDL(r+4) will be described.

The interconnects 115a to 115e may include, for example, copper (Cu), but the material of the interconnects 115a to 115e is not limited thereto.

As shown in FIG. 5, the source driver chip SDIC1 mounted on the first flexible circuit board SFPC1 may generate data voltages for driving the pixels CPXr to CPX (r+4) electrically connected thereto through the connection pad 130. The data voltages thus generated may be transferred to the data lines SDLr to SDL(r+4) through the connection pads 130.

The flexible circuit boards SFPC1 may include first contact pads CP1, respectively. The source driver chip SDIC1 may be electrically connected to the first contact pad CP1 of the flexible circuit board SFPC1. The first contact pad CP1 of the flexible circuit board SFCP1 may be electrically connected to the connection pad 130 positioned on the side surface of the first substrate 100 through the adhesive film 400. For example, the first substrate 100 is shorter than the second substrate 300 by a first distance d1 in the second direction DR2. Accordingly, the connection pads 130 connected to the interconnects 115 are positioned on the side surface of the first substrate 100 and under the second substrate 300. The first distance d1 may range, but is not limited to, from 0.3 mm to 0.5 mm. As such, the connection pad 130 is positioned on the side surface of the first substrate 100 and under the second substrate 300, so that it is possible to further reduce the bezel of each of the display devices 1 at the connection portion for implementing the tiled display apparatus TD.

The connection pad 130 may be attached to the flexible circuit board SFPC1 via the adhesive film 400. For example, the connection pad 130 may be electrically connected to the first contact pad CP1 of the flexible circuit board SFPC1 by an outer lead bonding (OLB) technique using the adhesive film 400.

According to some example embodiments, the adhesive film 400 may be positioned over the entirety of the connection pad 130, but the present disclosure is not limited thereto. In some example embodiments, the adhesive film 400 may cover a part of connection pad 130 while exposing the other part of the connection pad 130. The connection pads 130 may be made of, but is not limited to, aluminum (Al), silver (Ag) or the like.

In some example embodiments, the adhesive film 400 may include an anisotropic conductive film (ACF). When the adhesive film 400 is an anisotropic conductive film, only the part of the adhesive film 400 in contact with the connection pad 130 and the first contact pad CP1 of the flexible circuit board SFPC1 may have conductivity, thereby electrically connecting the first connection pads 130 with the first contact pad CP1 of the first flexible circuit board SFPC1. It is, however, to be understood that the present disclosure is not limited thereto. In some implementations, the adhesive film 400 may be eliminated. For example, the connection pad 130 may be in contact with and electrically connected to the first contact pad CP1. In such case, the connection pad 130 may be directly connected to the first contact pad CP1 by ultrasonic bonding, welding, or the like. In addition, as the connection pad 130 is positioned on the side surface of the first substrate 100 and under the second substrate 300, the flexible circuit board SFPC1 connected to the connection pad 130 is also positioned on the side surface of the first substrate 100 and under the second substrate 300.

The driving circuit board SPCB may be electrically connected to the flexible circuit boards SFPC1. Specifically, the flexible circuit boards SFPC1 may be electrically connected to the driving circuit board SPCB by electrically connecting second contact pads CP2 of the flexible circuit board SFPC1 with third contact pads CP3 of the driving circuit board SPCB.

Accordingly, the source driver chips SDIC1 may also be electrically connected to the driver circuit board SPCB.

In some example embodiments, the flexible circuit boards SFPC1 may be provided in the form of flexible printed circuit boards. Specifically, the flexible circuit boards SFPC1 may be implemented as chip-on-film (COF). Accordingly, the data driver SDD may be connected to the first substrate 100 and the driver circuit board SPCB by a tape carrier package (TCP) technique, and the source flexible circuit boards SFPC1 may be bent toward the rear surface of the first substrate 100 such that the printed circuit board SPCB may be located under the middle frame MC.

The connection pad 130 may be electrically connected to the interconnect 115 positioned on the first substrate 100, as shown in FIG. 5. As described above, the connection pad 130 may be electrically connected to the interconnect 115, and the interconnect 115 may be extended inside the first substrate 100 (for example, in the second direction DR2) to be electrically connected to the pixel SPX.

On one side of the display panel DPN, the first substrate 100 and the second substrate 300 opposed to the first substrate 100 may be positioned.

Each of the first substrate 100 and the second substrate 300 may be a rigid substrate made of glass, quartz or the like, or a flexible substrate made of polyimide or other polymer resins. When a polyimide substrate is employed as the substrate, the display panel DPN can be bent, curved, folded or rolled, so that the display panel DPN can be implemented in a variety of forms.

As described above, the interconnect 115 positioned on the first substrate 100 may be electrically connected to the plurality of data lines SDLr to SDL(r+4) and the plurality of gate lines SGL1 to SGLm (see FIG. 2).

A spacer CS may be positioned between the first substrate 100 and the second substrate 300 as shown in FIG. 5. The spacers CS may be positioned along the edges of the first and second substrates 100 and 300 to prevent leakage of the liquid-crystal layer 200 between the two substrates 100 and 300.

The spacer CS may include a first spacer CS1 in contact with the first substrate 100 and the interconnect 115 and a second spacer CS2 in contact with the second substrate 300. In some example embodiments, the first spacer CS1 may include a blue colorant. For example, the first spacer CS1 may be made of a blue photoresist. It is, however, to be understood that this is merely illustrative. When the first spacer CS1 includes a blue colorant, there is an advantage that it is possible to more efficiently block leakage of light through the side surface.

According to some example embodiments, a common electrode for applying an electric field to the liquid-crystal layer 200 together with the pixel electrode of the first substrate 100 may be positioned on the second substrate 300, but the present disclosure is not limited thereto.

According to some example embodiments, a first polarizing member and a second polarizing member for selectively transmitting only specific light may be positioned in the display panel DPN. For example, the first polarizing member may be positioned between the backlight unit BLU and the first substrate 100, and the second polarizing member may be positioned on the upper surface of the second substrate 300. It is, however, to be understood that this is merely illustrative.

The backlight unit BLU may generate light and may provide the generated light to the first substrate 100, the liquid-crystal layer 200 and the second substrate 300. The display panel DPN including the first substrate 100, the liquid-crystal layer 200 and the second substrate 300 may generate an image using the light provided from the backlight unit BLU, and may provide it to the outside. In the example shown in FIG. 3, a direct type backlight unit BLU is employed. It is, however, to be understood that the present disclosure is not limited thereto. In some example embodiments, an edge type backlight unit BLU may be employed.

In some example embodiments, the backlight unit BLU may include an optical member LM and a light source LS. The optical member LM may include a diffusion sheet, a light condensing sheet, and a protective sheet, for example. The diffusion sheet serves to diffuse the incident light. The light condensing sheet serves to increase the luminance of the diffused light. The protective sheet can protect the light condensing sheet and can ensure a viewing angle. It is, however, to be understood that the present disclosure is not limited thereto. In some example embodiments, the optical member LM may include only some of the diffusion sheet, the light condensing sheet and the protective sheet. In some example embodiments, the optical member LM may include an additional optical sheet in addition to the diffusion sheet, the light condensing sheet and the protective sheet.

In some example embodiments, the light source LS is accommodated in the bottom cover BC. For example, a plurality of light sources LS is positioned on the bottom BC1 of the bottom cover BC. Light emitted from the light source LS may be incident on the optical member LM and the display panel DPN. In addition, according to some example embodiments, in order to improve the efficiency of outputting light, a reflection plate may be further positioned between the light source LS and the bottom BC1.

Each of the light sources LS may be at least one of a cold cathode fluorescent lamp (CCFL), a flat fluorescent lamp (FFL), and a light-emitting diode (LED).

Figure 33:
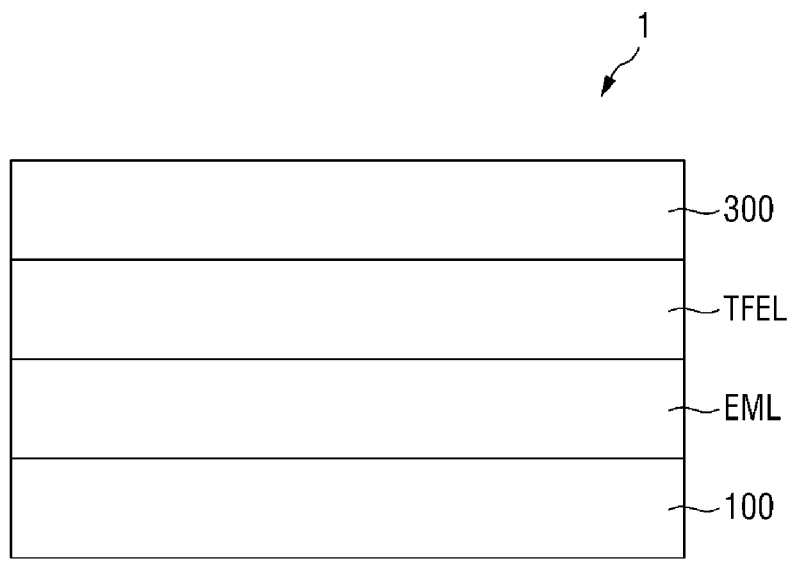
FIG. 33 is a cross-sectional view of a display device according to some example embodiments of the present disclosure.

It is, however, to be understood that this is merely illustrative. In some example embodiments, the display device 1 may be implemented as an organic light-emitting display device as shown in FIG. 33. In such case, an organic EL layer EML and/or a thin-film encapsulation layer TFEL may be positioned between the first substrate 100 and the second substrate 300. For example, the organic EL layer EML may include pixels including a first electrode, an emissive layer and a second electrode, and a bank for defining the pixels. The emissive layer may be an organic emissive layer containing an organic material. Then, the emissive layer may include a hole transporting layer, an organic light-emitting layer and an electron transporting layer. When a voltage is applied to the first electrode and a cathode voltage is applied to the second electrode through the thin-film transistor, the holes and electrons move to the organic light-emitting layer through the hole transporting layer and the electron transporting layer, respectively, such that they combine in the organic light-emitting layer to emit light.

The thin-film encapsulation layer TFEL serves to prevent oxygen or moisture from permeating into the organic EL layer EML. To this end, the thin-film encapsulation layer TFEL may include at least one inorganic layer. The inorganic layer may be, but not limited to, a silicon nitride layer, a silicon oxynitride layer, a silicon oxide layer, a titanium oxide layer, or an aluminum oxide layer. In addition, the thin-film encapsulation layer TFEL protects the organic EL layer EML from foreign substances such as dust. To this end, the thin-film encapsulation layer TFEL may include at least one organic layer. The organic layer may be formed of, but is not limited to, an acryl resin, an epoxy resin, a phenolic resin, a polyamide resin and a polyimide resin.

As such, when the organic EL layer EML and/or the thin-film encapsulation layer TFEL is positioned between the first substrate 100 and the second substrate 300, the backlight unit BLU may be eliminated.

The bottom cover BC may be a container having an open top and an accommodating space with a predetermined depth. For example, the bottom cover BC may include a bottom BC1 and sidewalls BC2.

In some example embodiments, the bottom BC1 may be flat and may be formed in a quadrangular shape when viewed from the top. It is, however, to be understood that the present disclosure is not limited thereto. In some example embodiments, the bottom BC1 may have a curvature, or may be formed in a polygonal shape other than a circular shape or a quadrangular shape when viewed from the top.

In some example embodiments, the sidewalls BC2 may be extended in the third direction DR3 from the edges of the bottom BC1, respectively. In addition, bottom cover holes BCH may be formed on one of the sidewalls BC2 where the flexible circuit boards SFPC1 are located. The bottom cover holes BCH can provide space in which the flexible circuit boards SFPC1 are accommodated when the flexible circuit boards SFPC1 are bent.

The middle frame MC may have an open top and an open bottom. For example, the middle frame MC may be implemented as a quadrangular frame. It is, however, to be understood that this is merely illustrative.

The middle frame MC may be seated on the bottom cover BC and may expose the light source LS positioned on the bottom cover BC. The optical member LM is located on the middle frame MC, and the light source LS may be spaced apart from the optical member LM by the middle frame MC. However, such a structure is merely illustrative, and the present disclosure is not limited thereto.

Figure 8:
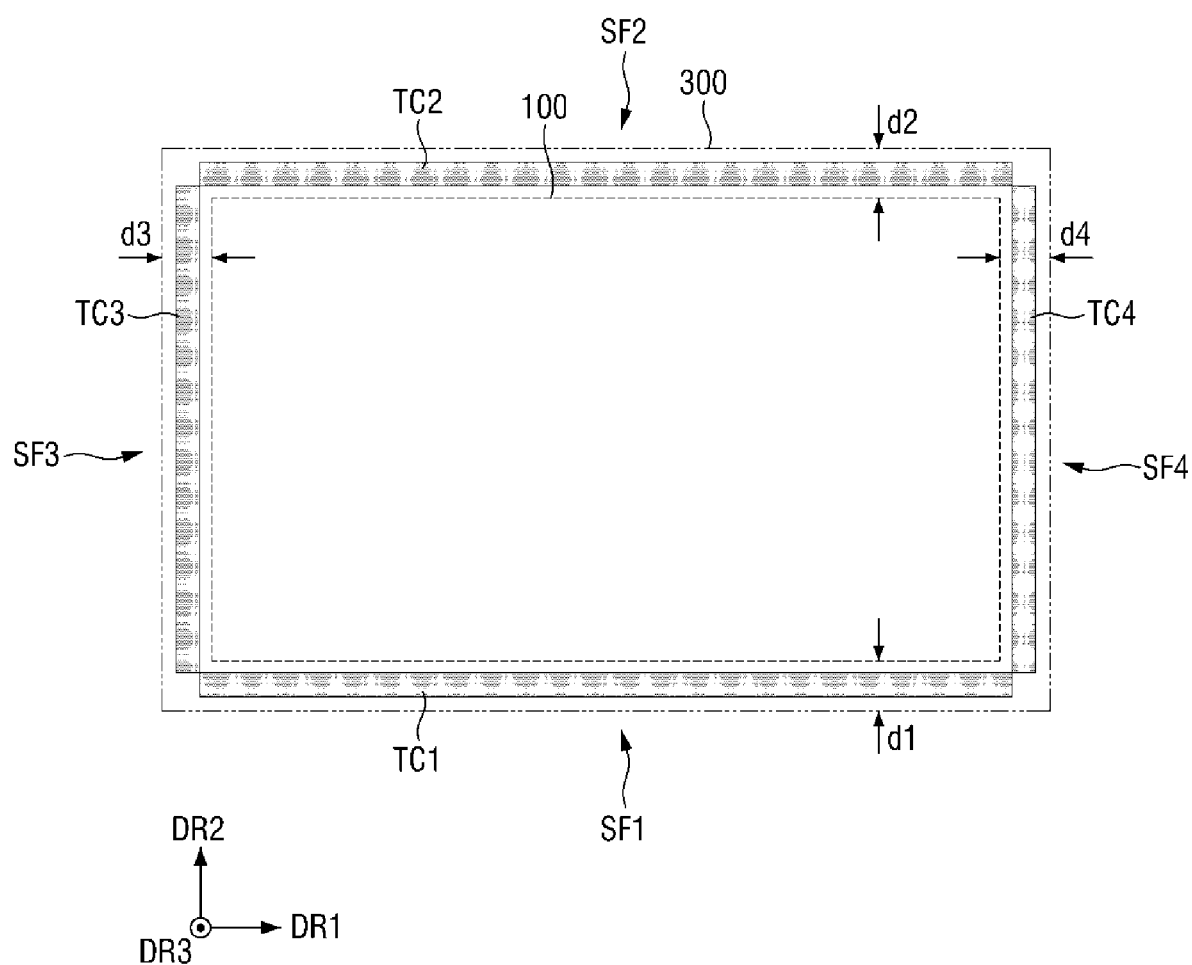
FIG. 8 is a view showing a layout of a first substrate, a second substrate and cover members according to some example embodiments of the present disclosure.

The cover members TC may be positioned to surround the side surfaces of the display panel DPN. For example, when the area of the first substrate 100 is smaller than the area of the second substrate 300 and the four side surfaces of the first substrate 100 are positioned more to the inside than the four side surfaces of the second substrate 300 as shown in FIG. 8, the cover members TC may surround the side surfaces of the first substrate 100. In some example embodiments, the cover members TC may include a first cover member TC1, a second cover member TC2, a third cover member TC3, and a fourth cover member TC4. The first cover member TC1, the second cover member TC2, the third cover member TC3 and the fourth cover member TC4 may be adhered and fixed on the four sides of the first substrate 100, respectively. It is, however, to be understood that the present disclosure is not limited thereto. The cover member TC may be formed of five or more individual members, or the cover member TC may be formed as a single piece.

The cover member TC may be fixedly coupled to the bottom cover BC. For example, in some example embodiments, the side surfaces of the cover members TC may be fixed to the sidewalls of the bottom cover BC by screws or the like. In some example embodiments, the side surfaces of the cover member TC may be fixed to the sidewalls BC2 of the bottom cover BC by an adhesive member or the like.

The cover members TC may be made of, but is not limited to, SUS, PET, nonwoven fabric, tape or the like.

Figure 6:
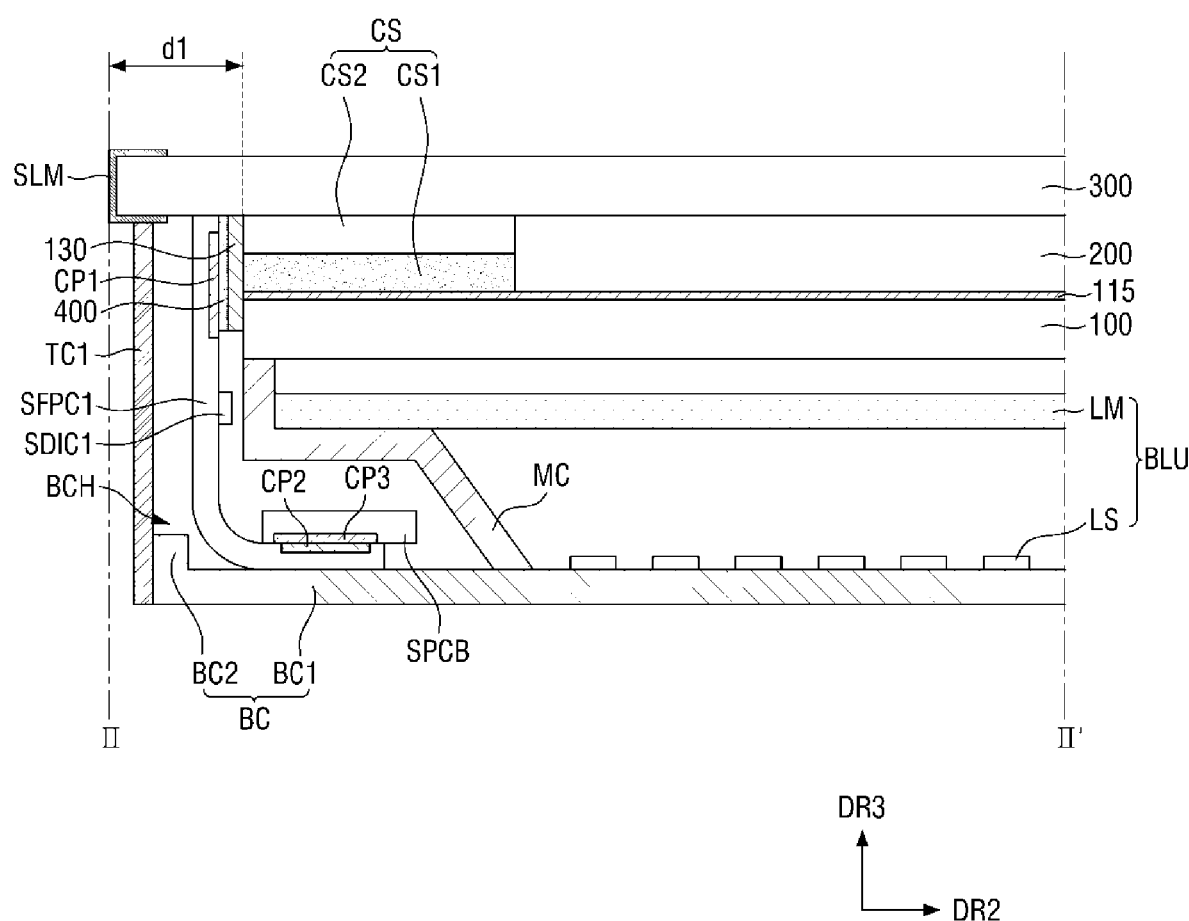
FIG. 6 is a cross-sectional view of a display device according to some example embodiments of the present disclosure, taken along the line II-II' of FIG. 2.
Figure 7:
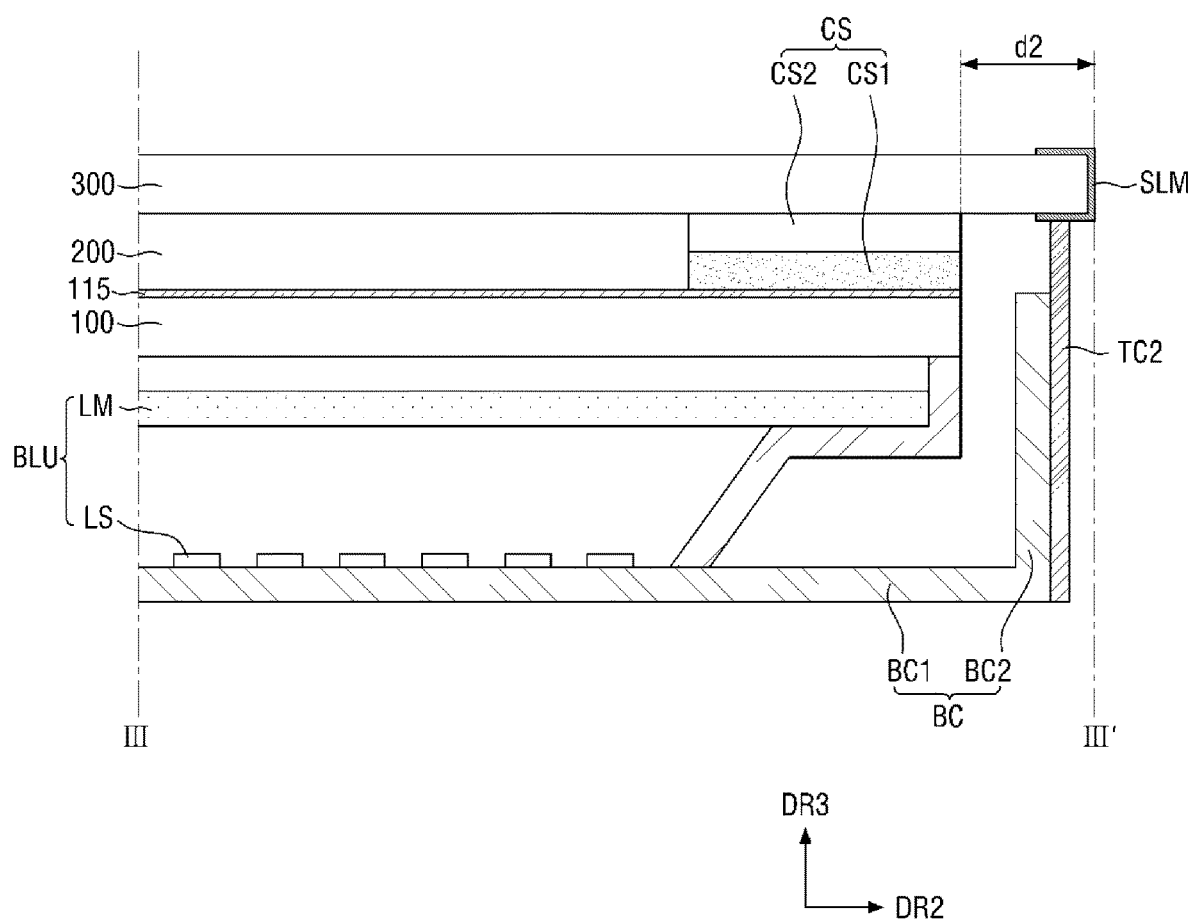
FIG. 7 is a cross-sectional view of a display device according to some example embodiments of the present disclosure, taken along the line III-III' of FIG. 3.

FIG. 6 is a cross-sectional view of a display device according to some example embodiments of the present disclosure, taken along the line II-II' of FIG. 2. FIG. 7 is a cross-sectional view of a display device according to some example embodiments of the present disclosure, taken along the line III-III' of FIG. 3.

In the following description, an example is described where the area of the first substrate 100 is smaller than the area of the second substrate 300 and the four sides of the first substrate 100 are more to the inside than the four sides of the second substrate 300, as shown in FIG. 8. In addition, a first cover member TC1 is located on the side surface of a display panel DPN where the flexible circuit board SFPC1 is positioned and a second cover member TC2 is opposed to the first cover member TC1 with the display panel DPN therebetween.

Referring to FIG. 6, the first substrate 100 may recede from the second substrate 300 in the second direction DR2 by a first distance d1. For example, the first substrate 100 may be cut by the first distance d1. The first substrate 100 may be a TFT substrate, and the second substrate 300 may be a color filter substrate. As described above, the first distance d1 may range, but is not limited to, from 0.3 mm to 0.5 mm.

The flexible circuit board SFPC1 connected to one side surface of the first substrate 100 by an outer lead bonding (OLB) technique may be positioned.

The liquid-crystal layer 200, the first spacer CS1 and the second spacer CS2 may be positioned between the first substrate 100 and the second substrate 300.

The first spacer CS1 and the second spacer CS2 may be positioned where the first substrate 100 and the second substrate 300 overlap with each other in the third direction DR3. For example, the first spacer CS1 and the second spacer CS2 may be aligned with the end of the first substrate 100 in the third direction DR3. It is, however, to be understood that the present disclosure is not limited thereto. In some example embodiments, only one of the first spacer CS1 and the second spacer CS2 may be aligned with the end of the first substrate 100 in the third direction DR3.

The connection pad 130 may be positioned on the side surfaces of the first substrate 100, the interconnect 115, the first spacer CS1 and the second spacer CS2 and under the second substrate 300. The upper end of the flexible circuit board SFPC1 connected to the connection pad 130 may be located on one side surface of the first substrate 100 and under the second substrate 300, while the driver circuit board SPCB and the lower end of the flexible circuit board SFPC1 connected to the driver circuit board SPCB may be bent over below the first substrate 100. The first substrate 100 recedes from the second substrate 300 in the second direction DR2 by the first distance d1 as described above, and thus the connection pad 130 and the flexible circuit board SFPC1 connected to the connection pad 130 can be located below the second substrate 300.

The driver circuit board SPCB and the lower end of the flexible circuit board SFPC1 connected to the driver circuit board SPCB may be seated on the bottom BC1 of the bottom cover BC. In addition, the sidewall BC2 of the bottom cover BC includes the bottom cover hole BCH, thereby providing space in which the flexible circuit board SFPC1 can be accommodated.

The first cover member TC1 may be positioned on the outer side of the flexible circuit board SFPC1 and under the second substrate 300. Specifically, the first cover member TC1 may be located on the opposite side of the flexible circuit board SFPC1 in the second direction DR2, and may overlap the second substrate 300 in the third direction DR3.

The first cover member TC1 and the flexible circuit board SFPC1 may be spaced apart from each other in the second direction DR2. It is, however, to be understood that the present disclosure is not limited thereto. The first cover member TC1 may be in contact with the flexible circuit board SFPC1 in the second direction DR2.

A light-blocking member SLM for preventing light leakage may be positioned on a corner and a side surface of the second substrate 300. The upper end of the first cover member TC1 may be adhered and fixed to the light-blocking member SLM by an adhesive member. It is, however, to be understood that the present disclosure is not limited thereto. The upper end of the first cover member TC1 may be adhered and fixed to the second substrate 300 by an adhesive member.

The lower end of the first cover member TC1 may be coupled with the sidewall BC2 of the bottom cover BC. For example, the lower end of the first cover member TC1 may be adhered and fixed to the sidewall BC2 of the bottom cover BC by an adhesive member. In some example embodiments, the lower end of the first cover member TC1 may be fixed to the sidewall BC2 of the bottom cover BC by a fixing member such as a screw or the like.

The first cover member TC1 may be in a bar shape extended in the third direction DR3. It is, however, to be understood that the present disclosure is not limited thereto. In some example embodiments, the lower end of the first cover member TC1 may be bent toward the bottom BC1 of the bottom cover BC and may be fixed to the sidewall BC2 and the bottom BC1 of the bottom cover BC.

The first cover member TC1 may not be in line with one side surface of the second substrate 300 in the third direction DR3. For example, the first cover member TC1 may be moved in the opposite direction to the second direction DR2 from the side surface of the second substrate 300. As such, when the first cover member TC1 is moved in the second direction DR2 from the side surface of the second substrate 300 as described above, there is an advantage that a space for coupling the cover members TC can be formed under the second substrate 300 when the tiled display apparatus TD is implemented. Accordingly, it is possible to prevent the bezel from being increased due to the space for coupling. It is, however, to be understood that the present disclosure is not limited thereto. The first cover member TC1 may be aligned with the side surface of the second substrate 300 in the third direction DR3.

Referring to FIG. 7, the first substrate 100 may recede in the second direction DR2 by a second distance d2 from the second substrate 300. For example, the first substrate 100 may be cut by the second distance d2. The first substrate 100 may be a TFT substrate, and the second substrate 300 may be a color filter substrate. The second distance d2 may be equal to the first distance d1. For example, the second distance d2 may range, but is not limited to, from 0.3 mm to 0.5 mm. In some example embodiments, the second distance d2 may be smaller than the first distance d1 because the flexible circuit board SFPC1 is not utilized.

The liquid-crystal layer 200, the first spacer CS1 and the second spacer CS2 surrounding the liquid-crystal layer 200 may be positioned between the first substrate 100 and the second substrate 300.

The first spacer CS1 and the second spacer CS2 may be positioned where the first substrate 100 and the second substrate 300 overlap with each other in the third direction DR3. For example, the first spacer CS1 and the second spacer CS2 may be aligned with the end of the first substrate 100 in the third direction DR3. It is, however, to be understood that the present disclosure is not limited thereto. In some example embodiments, only one of the first spacer CS1 and the second spacer CS2 may be aligned with the end of the first substrate 100 in the third direction DR3.

The bottom cover BC includes a bottom BC1 and sidewalls BC2, but no bottom cover hole BCH is formed in the sidewall BC2. For example, the sidewall BC2 may be bent from the end of the bottom BC1 in the third direction DR3 and may be extended to the side surface of the first substrate 100. It is, however, to be understood that the present disclosure is not limited thereto. In some example embodiments, the sidewall BC2 may be bent at the end of the bottom BC1 in the third direction DR3 and extended to the side of the middle frame MC. In some example embodiments, the sidewall BC2 may be bent at the end of the bottom BC1 in the third direction DR3 to the lower surface of the second substrate 300.

The second cover member TC2 may be spaced apart from the side surface of the first substrate 100 in the second direction DR2 and may be located under the second substrate 300. Specifically, the upper end of the second cover member TC2 may be adhered and fixed to the light-blocking member SLM by the adhesive member. It is, however, to be understood that the present disclosure is not limited thereto. The upper end of the second cover member TC2 may be adhered and fixed to the second substrate 300 by an adhesive member. The side surface of the second cover member TC2 may be coupled with the sidewall BC2 of the bottom cover BC. For example, the lower end of the second cover member TC2 may be adhered and fixed to the sidewall BC2 of the bottom cover BC by an adhesive member. In some example embodiments, the lower end of the second cover member TC2 may be fixed to the sidewall BC2 of the bottom cover BC by a fixing member such as a screw or the like.

The second cover member TC2 may be in a bar shape extended in the third direction DR3. It is, however, to be understood that the present disclosure is not limited thereto. In some example embodiments, the lower end of the second cover member TC2 may be bent toward the bottom BC1 of the bottom cover BC and may be fixed to the sidewall BC2 and the bottom BC1 of the bottom cover BC.

The first cover member TC1 and the second cover member TC2 may have the same shape. For example, the first cover member TC1 and the second cover member TC2 may have a bar shape extended in the third direction DR3 and may have the same length in the third direction DR3. It is, however, to be understood that the present disclosure is not limited thereto. The first cover member TC1 and the second cover member TC2 may have different shapes, thicknesses, and lengths.

The second cover member TC2 may not be in line with the side surface of the second substrate 300 in the third direction DR3. For example, the second cover member TC2 may be moved in the opposite direction to the second direction DR2 from the side surface of the second substrate 300. As such, when the second cover member TC2 is moved in the opposite direction to the second direction DR2 from the side surface of the second substrate 300 as described above, there is an advantage that a space for coupling the cover members TC can be formed under the second substrate 300 when the tiled display apparatus TD is implemented. Accordingly, it is possible to prevent the bezel from being increased due to the space for coupling. It is, however, to be understood that the present disclosure is not limited thereto. The second cover member TC2 may be aligned with the side surface of the second substrate 300 in the third direction DR3.

According to some example embodiments, the third cover member TC3 and the fourth cover member TC4 may have the same configuration as either the first cover member TC1 or the second cover member TC2.

Figure 9:
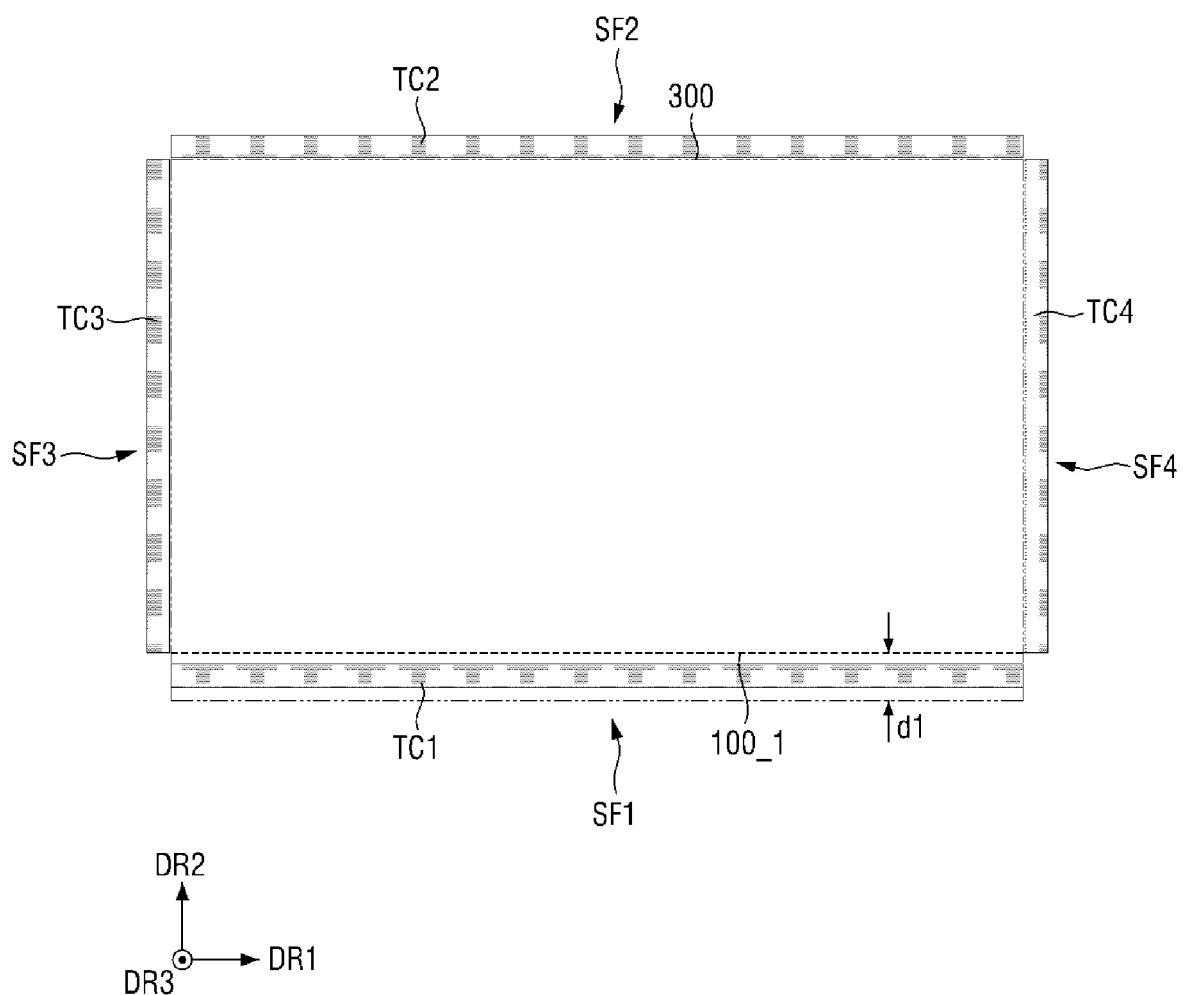
FIG. 9 is a view showing a layout of a first substrate, a second substrate and cover members according to some example embodiments of the present disclosure.
Figure 10:
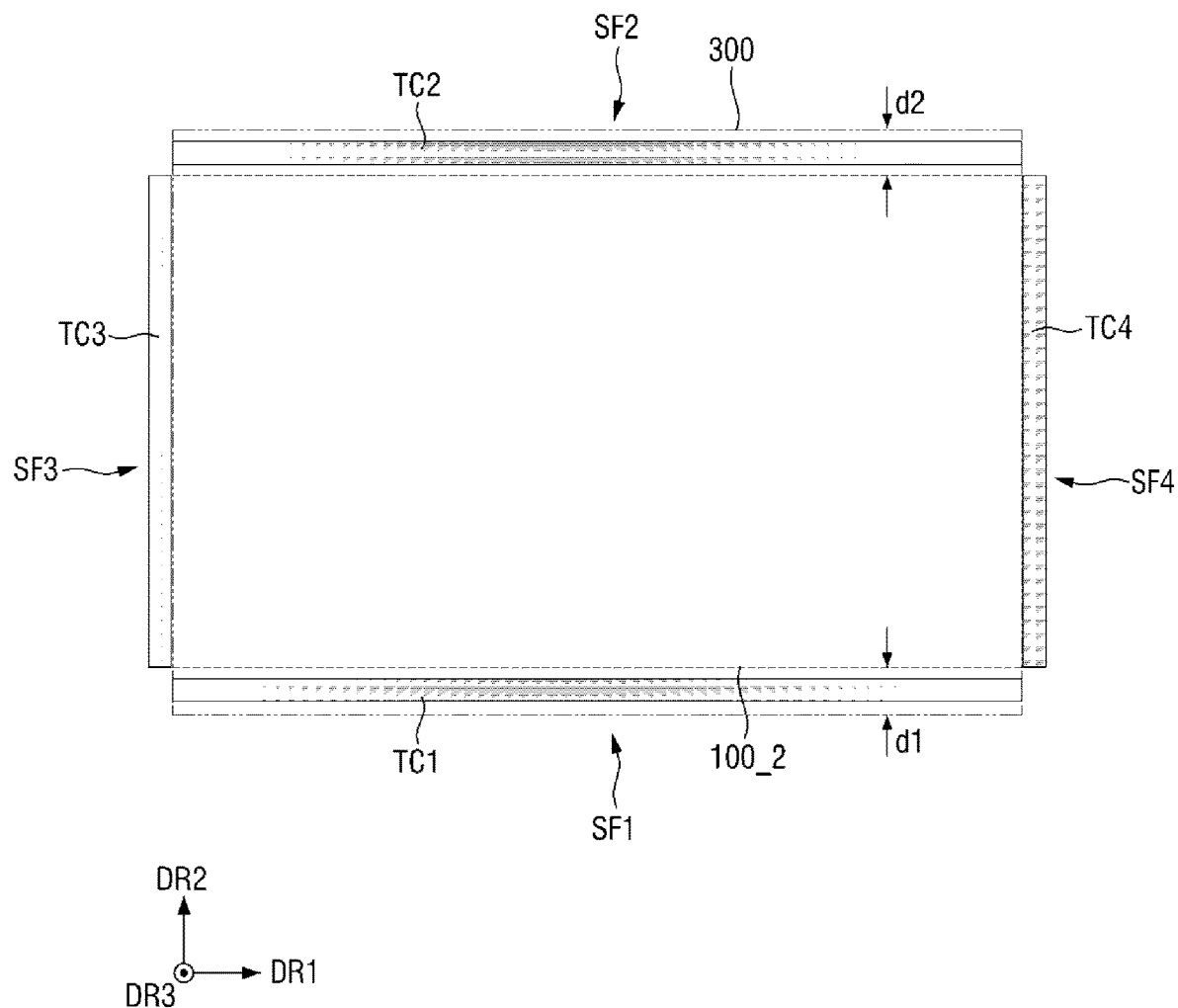
FIG. 10 is a view showing a layout of a first substrate, a second substrate and cover members according to some example embodiments of the present disclosure.
Figure 11:
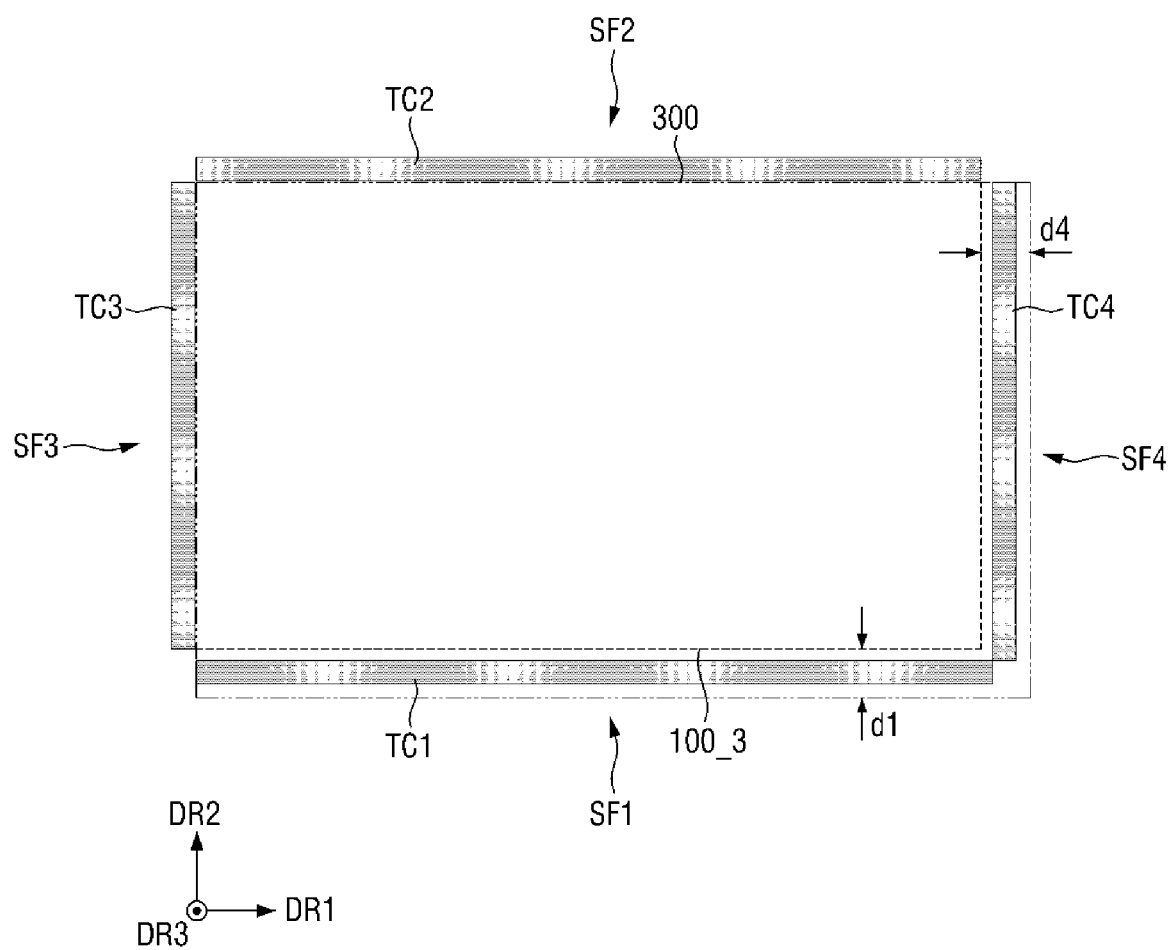
FIG. 11 is a view showing a layout of a first substrate, a second substrate and cover members according to some example embodiments of the present disclosure.
Figure 12:
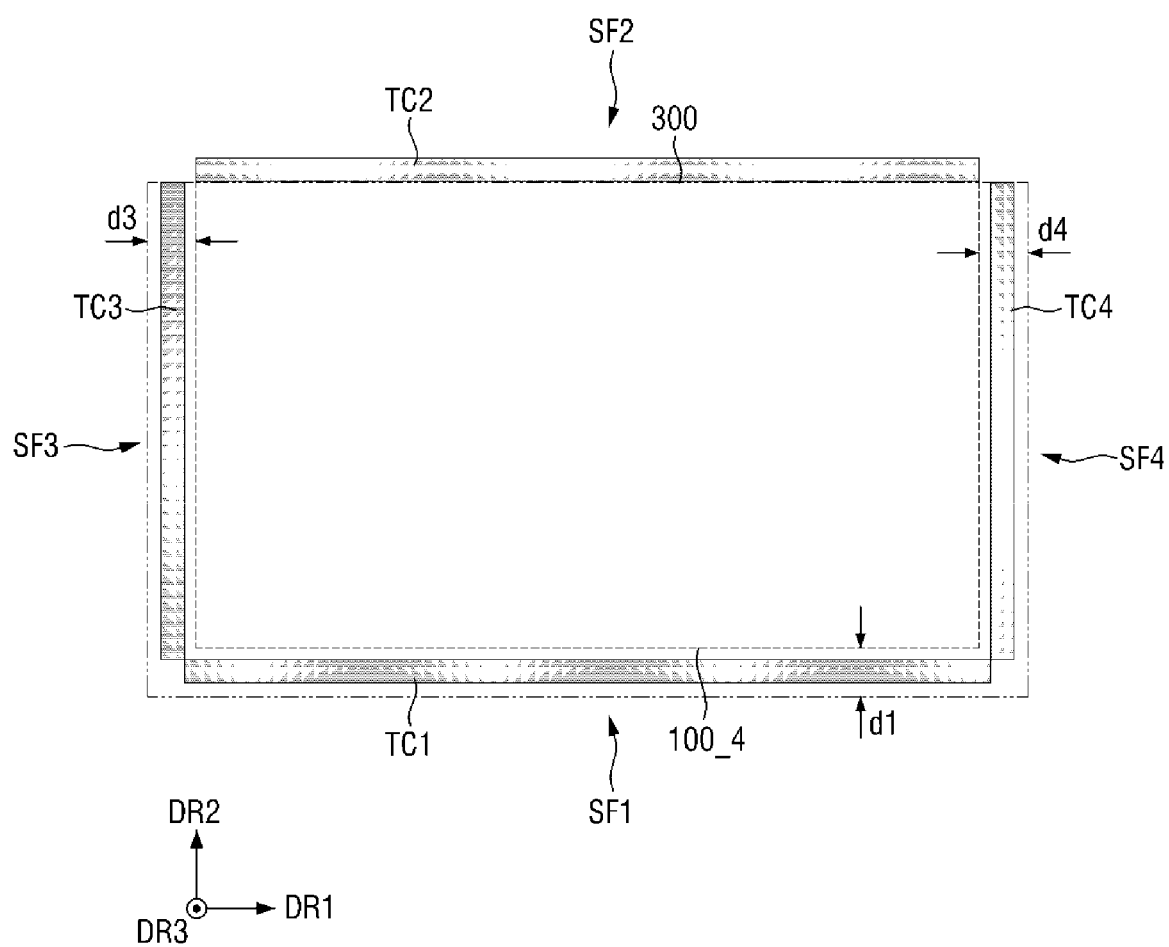
FIG. 12 is a view showing a layout of a first substrate, a second substrate and cover members according to some example embodiments of the present disclosure.

FIG. 8 is a view showing a layout of a first substrate, a second substrate and cover members according to some example embodiments of the present disclosure. FIG. 9 is a view showing a layout of a first substrate, a second substrate and cover members according to some example embodiments of the present disclosure. FIG. 10 is a view showing a layout of a first substrate, a second substrate and cover members according to some example embodiments of the present disclosure. FIG. 11 is a view showing a layout of a first substrate, a second substrate and cover members according to some example embodiments of the present disclosure. FIG. 12 is a view showing a layout of a first substrate, a second substrate and cover members according to some example embodiments of the present disclosure.

In FIGS. 8 to 12, the first substrate 100 is indicated by a dashed line while the second substrate 300 is indicated by a two-dot chain line. The first substrate 100 is a TFT substrate on which thin-film transistors are positioned, and the second substrate 300 is a color filter substrate on which color filters are positioned.

Referring to FIG. 8, according to some example embodiments of the present disclosure, the first substrate 100 and the second substrate 300 may include a first side face SF1, a second side face 112 opposed to the first side face SF1 in the second direction DR2, a third side face SF3 and a fourth side face SF4 opposed to the third side face SF3 in the first direction DR1.

The first substrate 100 is positioned under the second substrate 300 and the area of the first substrate 100 may be different from the area of the second substrate 300. For example, the area of the second substrate 300 may be larger than the area of the first substrate 100. Such difference in area may be formed by cutting a part of the first substrate 100, but the present disclosure is not limited thereto.

The first side face SF1, the second side face SF2, the third side face SF3 and the fourth side face SF4 of each of the first substrate 100 and the second substrate 300 may not be in line with one another in the third direction DR3. Specifically, the first side face SF1 of the second substrate 300 may protrude from the first side face SF1 of the first substrate 100 by a first distance d1 in the opposite direction to the second direction DR2. The second side face SF2 of the second substrate 300 may protrude from the second side face SF2 of the first substrate 100 by a second distance d2 in the second direction DR2. The third side face SF3 of the second substrate 300 may protrude from the third side face SF3 of the first substrate 100 by a third distance d3 in the opposite direction to the first direction DR1. The fourth side face SF4 of the second substrate 300 may protrude from the fourth side face SF4 of the first substrate 100 by a fourth distance d4 in the first direction DR1. The first distance d1 may range, but is not limited to, from 0.3 mm to 0.5 mm. The second distance d2, the third distance d3 and the fourth distance d4 may be, but is not limited to being, equal to the first distance d1. In some example embodiments, the second distance d2, the third distance d3 and the fourth distance d4 may be smaller than the first distance d1, and in some example embodiments, the first distance d1, the second distance d2, the third distance d3 and the fourth distance d4 may be different from one another.

The first cover member TC1 may overlap the second substrate 300 in the third direction DR3 and may not overlap the first substrate 100 in the third direction DR3. For example, the first cover member TC1 may be located under the second substrate 300 within the first distance d1.

The second cover member TC2 may overlap the second substrate 300 in the third direction DR3 and may not overlap the first substrate 100 in the third direction DR3. For example, the second cover member TC2 may be located under the second substrate 300 within the second distance d2.

The third cover member TC3 may overlap the second substrate 300 in the third direction DR3 and may not overlap the first substrate 100 in the third direction DR3. For example, the third cover member TC3 may be located under the second substrate 300 within the third distance d3.

The fourth cover member TC4 may overlap the second substrate 300 in the third direction DR3 and may not overlap the first substrate 100 in the third direction DR3. For example, the fourth cover member TC4 may be located under the second substrate 300 within the fourth distance d4.

Referring to FIG. 9, according to some example embodiments, the area of a first substrate 100_1 may be smaller than the area of a second substrate 300.

The first side face SF1 of the first substrate 100_1 may not be in line with the first side face SF1 of the second substrate 300 in the third direction DR3, while the second side faces SF2, the third side faces SF3 and the fourth side faces SF4 may be aligned with one another in the third direction DR3.

Specifically, the first side face SF1 of the second substrate 300 may protrude from the first side face SF1 of the first substrate 100 by a first distance d1 in the opposite direction to the second direction DR2. The second side face SF2 of the second substrate 300 may be aligned with the second side face SF2 of the first substrate 100_1 in the third direction DR3. The third side face SF3 of the second substrate 300 may be aligned with the third side face SF3 of the first substrate 100_1 in the third direction DR3. The fourth side face SF4 of the second substrate 300 may be aligned with the fourth side face SF4 of the first substrate 100_1 in the third direction DR3. The first distance d1 may range, but is not limited to, from 0.3 mm to 0.5 mm.

The first cover member TC1 may overlap the second substrate 300 in the third direction DR3 and may not overlap the first substrate 100_1 in the third direction DR3. For example, the first cover member TC1 may be located under the second substrate 300 within the first distance d1.

The second cover member TC2 may not be in line with the second substrate 300 and the first substrate 100_1 in the third direction DR3. For example, the second cover member TC2 may be coupled to the second side face SF2 of each of the first substrate 100_1 and the second substrate 300.

The third cover member TC3 may not overlap the second substrate 300 and the first substrate 100_1 in the third direction DR3. For example, the third cover member TC3 may be coupled to the third side face SF3 of each of the first substrate 100_1 and the second substrate 300.

The fourth cover member TC4 may not overlap the second substrate 300 and the first substrate 100_1 in the third direction DR3. For example, the fourth cover member TC4 may be coupled to the fourth side face SF4 of each of the first substrate 100_1 and the second substrate 300.

Referring to FIG. 10, according to some example embodiments, the area of a first substrate 100_2 may be smaller than the area of a second substrate 300.

The first side face SF1 and the second side face SF3 of each of the first substrate 100_2 and the second substrate 300 may not be in line with one another in the third direction DR3, and the third side face SF3 and the fourth side face SF4 of each of the first substrate 100_2 and the second substrate 300 may be aligned with one another in the third direction DR3.

Specifically, the first side face SF1 of the second substrate 300 may protrude from the first side face SF1 of the first substrate 100_2 by a first distance d1 in the opposite direction to the second direction DR2. The second side face SF2 of the second substrate 300 may protrude from the second side face SF2 of the first substrate 100_2 by a second distance d2 in the second direction DR2. The third side face SF3 of the second substrate 300 may be aligned with the third side face SF3 of the first substrate 1002 in the third direction DR3. The fourth side face SF4 of the second substrate 300 may be aligned with the fourth side face SF4 of the first substrate 100_2 in the third direction DR3. The first distance d1 may range, but is not limited to, from 0.3 mm to 0.5 mm. In some example embodiments, the second distance d2 may be equal to the first distance d1. It is, however, to be understood that the present disclosure is not limited thereto. The second distance d2 may be smaller than the first distance d1, and in some example embodiments, the first distance d1 may be larger than the second distance d2.

The first cover member TC1 may overlap the second substrate 300 in the third direction DR3 and may not overlap the first substrate 100_2 in the third direction DR3. For example, the first cover member TC1 may be located under the second substrate 300 within the first distance d1.

The second cover member TC2 may overlap the second substrate 300 in the third direction DR3 and may not overlap the first substrate 100_2 in the third direction DR3. For example, the second cover member TC2 may be located under the second substrate 300 within the second distance d2.

The third cover member TC3 may not overlap the second substrate 300 and the first substrate 100_2 in the third direction DR3. For example, the third cover member TC3 may be coupled to the third side face SF3 of each of the first substrate 100_2 and the second substrate 300.

The fourth cover member TC4 may overlap the second substrate 300 and the first substrate 100_2 in the third direction DR3. For example, the fourth cover member TC4 may be coupled to the fourth side face SF4 of each of the first substrate 100_2 and the second substrate 300.

Referring to FIG. 11, according to some example embodiments, the area of a first substrate 100_3 may be smaller than the area of a second substrate 300.

The first side face SF1 and the fourth side face SF4 of each of the first substrate 100_3 and the second substrate 300 may not be in line with one another in the third direction DR3, and the second side face SF2 and the third side face SF3 of each of the first substrate 100_3 and the second substrate 300 may be aligned with one another in the third direction DR3.

Specifically, the first side face SF1 of the second substrate 300 may protrude from the first side face SF1 of the first substrate 100 by a first distance d1 in the opposite direction to the second direction DR2. The second side face SF2 of the second substrate 300 may be aligned with the second side face SF2 of the first substrate 100_3 in the third direction DR3. The third side face SF3 of the second substrate 300 may be aligned with the third side face SF3 of the first substrate 100_3 in the third direction DR3. The fourth side face SF4 of the second substrate 300 may protrude from the fourth side face SF4 of the first substrate 100_3 in the first direction DR1 by a fourth distance d4. The first distance d1 may range, but is not limited to, from 0.3 mm to 0.5 mm. In some example embodiments, the fourth distance d4 may be equal to the first distance d1. It is, however, to be understood that the present disclosure is not limited thereto. The fourth distance d4 may be smaller than the first distance d1, and in some example embodiments, the first distance d1 may be different from the fourth distance d4.

The first cover member TC1 may overlap the second substrate 300 in the third direction DR3 and may not overlap the first substrate 100_3 in the third direction DR3. For example, the first cover member TC1 may be located under the second substrate 300 within the first distance d1.

The second cover member TC2 may not overlap the second substrate 300 and the first substrate 100_3 in the third direction DR3. For example, the second cover member TC2 may be coupled to the second side face SF2 of each of the first substrate 100_3 and the second substrate 300.

The third cover member TC3 may not overlap the second substrate 300 and the first substrate 100_3 in the third direction DR3. For example, the third cover member TC3 may be coupled to the third side face SF3 of each of the first substrate 100_3 and the second substrate 300.

The fourth cover member TC4 may overlap the second substrate 300 in the third direction DR3 and may not overlap the first substrate 100_3 in the third direction DR3. For example, the fourth cover member TC4 may be located under the second substrate 300 within the fourth distance d4.

Referring to FIG. 12, according to some example embodiments, the area of a first substrate 100_4 may be smaller than the area of a second substrate 300.

The first side face SF1, the third side face SF3 and the fourth side face SF4 of each of the first substrate 100_4 and the second substrate 300 may not be in line with one another in the third direction DR3, and the second side face SF2 of each of the first substrate 100_4 and the second substrate 300 may be aligned with one another in the third direction DR3.

Specifically, the first side face SF1 of the second substrate 300 may protrude from the first side face SF1 of the first substrate 100_4 by a first distance d1 in the opposite direction to the second direction DR2. The second side face SF2 of the second substrate 300 may be aligned with the second side face SF2 of the first substrate 100_4 in the third direction DR3. The third side face SF3 of the second substrate 300 may protrude from the third side face SF3 of the first substrate 100_4 by a third distance d3 in the opposite direction to the first direction DR1. The fourth side face SF4 of the second substrate 300 may protrude from the fourth side face SF4 of the first substrate 100_4 by a fourth distance d4 in the first direction DR1. The first distance d1 may range, but is not limited to, from 0.3 mm to 0.5 mm. In some example embodiments, the third distance d3 and the fourth distance d4 may be equal to the first distance d1. It is, however, to be understood that the present disclosure is not limited thereto. The third distance d3 and the fourth distance d4 may be smaller than the first distance d1, and in some example embodiments, the first distance d1, the third distance d3 and the fourth distance d4 may be different from one another.

The first cover member TC1 may overlap the second substrate 300 in the third direction DR3 and may not overlap the first substrate 100_4 in the third direction DR3. For example, the first cover member TC1 may be located under the second substrate 300 within the first distance d1.

The second cover member TC2 may not overlap the second substrate 300 and the first substrate 100_4 in the third direction DR3. For example, the second cover member TC2 may be coupled to the second side face SF2 of each of the first substrate 100_4 and the second substrate 300.

The third cover member TC3 may overlap the second substrate 300 in the third direction DR3 and may not overlap the first substrate 100_4 in the third direction DR3. For example, the third cover member TC3 may be located under the second substrate 300 within the third distance d3.

The fourth cover member TC4 may overlap the second substrate 300 in the third direction DR3 and may not overlap the first substrate 100_4 in the third direction DR3. For example, the fourth cover member TC4 may be located under the second substrate 300 within the fourth distance d4.

Figure 13:
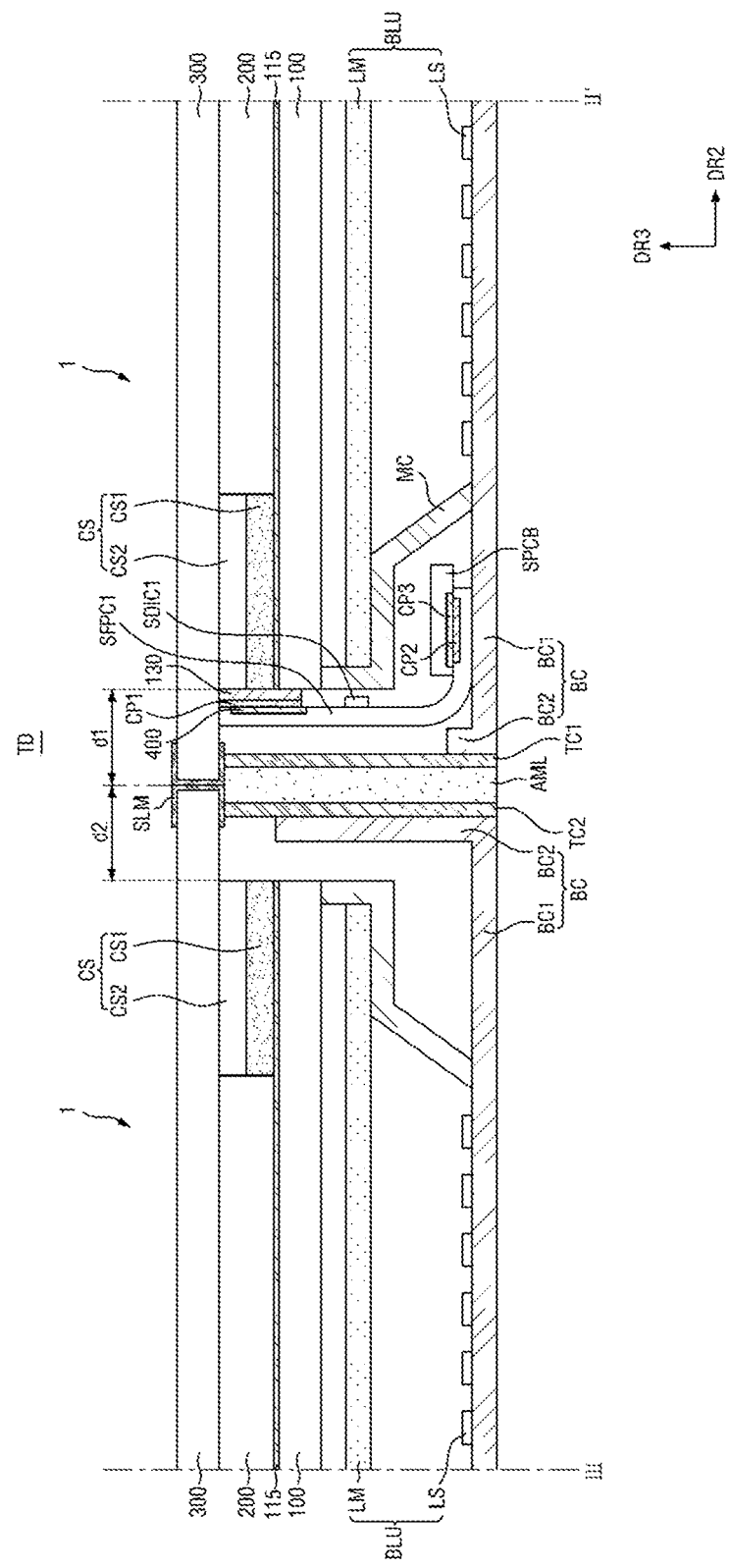
FIG. 13 is a cross-sectional view schematically showing a connection portion where display devices of a tiled display apparatus according to some example embodiments of the present disclosure are connected to each other.

FIG. 13 is a cross-sectional view schematically showing a connection portion where display devices of a tiled display apparatus according to some example embodiments of the present disclosure are connected to each other. The configuration of the individual display devices 1 of the tiled display apparatus has been described above; and, therefore, the redundant description will be omitted.

Referring to FIG. 13, as described above, the side surfaces of the display panels DPN included in the individual display devices 1 may have a step due to the difference in area between the first substrate 100 and the second substrate 300. For example, the first substrate 100 has a smaller area than the second substrate 300, and thus the second substrate 300 protrudes from the first substrate 100. The connection pad 130 and the flexible circuit board SFPC1 connected to the connection pad 130 are positioned under the protruding part of the second substrate 300. Further, the first cover member TC1 and the second cover member TC2 may be positioned under the protruding part of the second substrate 300.

The display panels DPN included in the individual display devices 1 are stably fixed to the first cover member TC1 and the second cover member TC2, and the individual display devices 1 can be connected to one another by the coupling member AML positioned between the first cover member TC1 and the second cover member TC2, so that the reliability of the tile display apparatus TD can be improved.

The first cover member TC1 and the second cover member TC2 are positioned more to the inside than the side surfaces of the second substrate, such that the space for accommodating the coupling member AML can be formed between the first cover member TC1 and the second cover member TC2, thereby reducing the size of the bezel. Accordingly, it is possible to suppress a lattice pattern on the tiled display apparatus TD that may be perceived by a viewer, to improve the quality of the displayed images.

Figure 14:
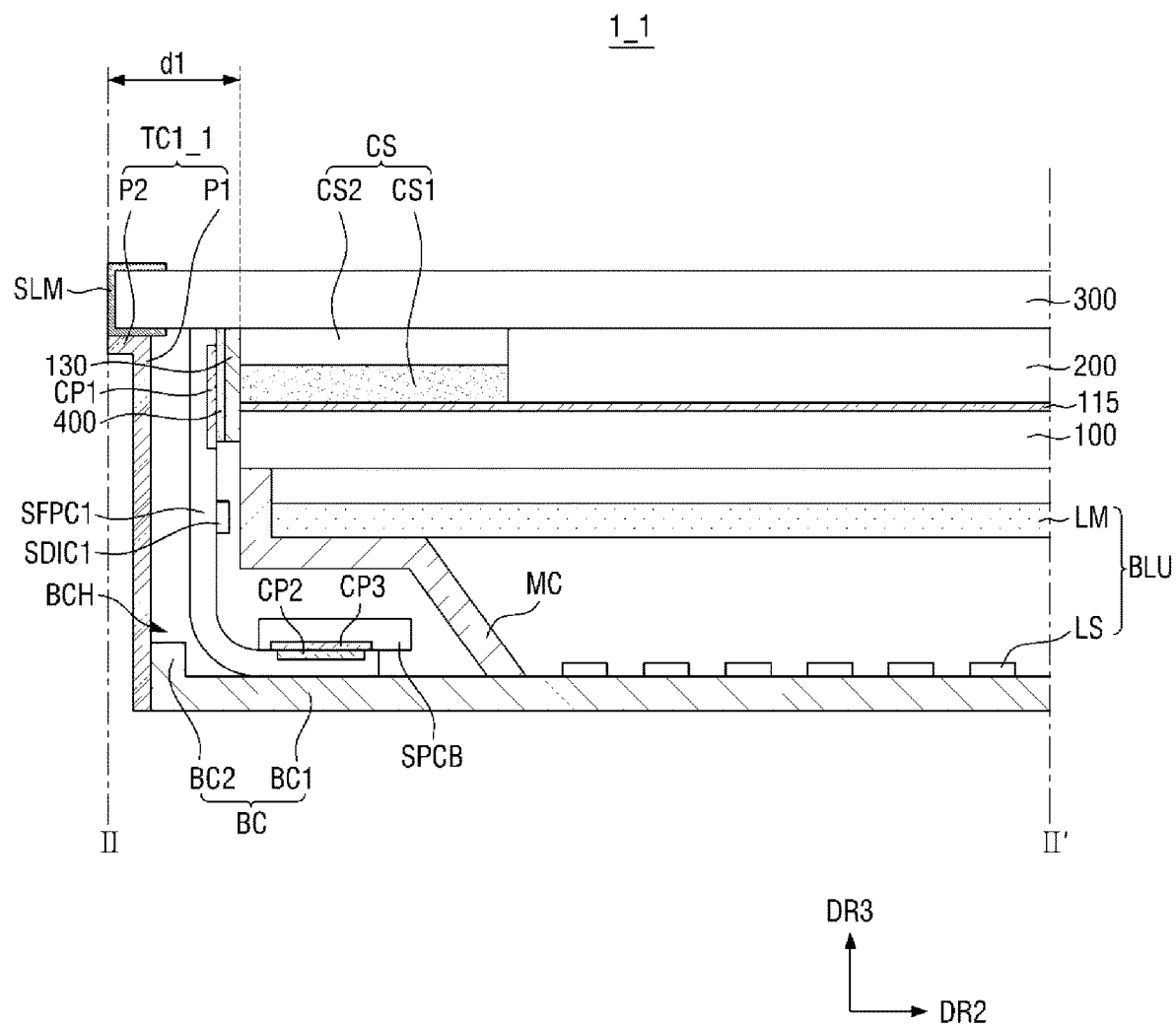
FIG. 14 is a cross-sectional view of a display device according to some example embodiments of the present disclosure, taken along the line II-II' of FIG. 2.
Figure 15:
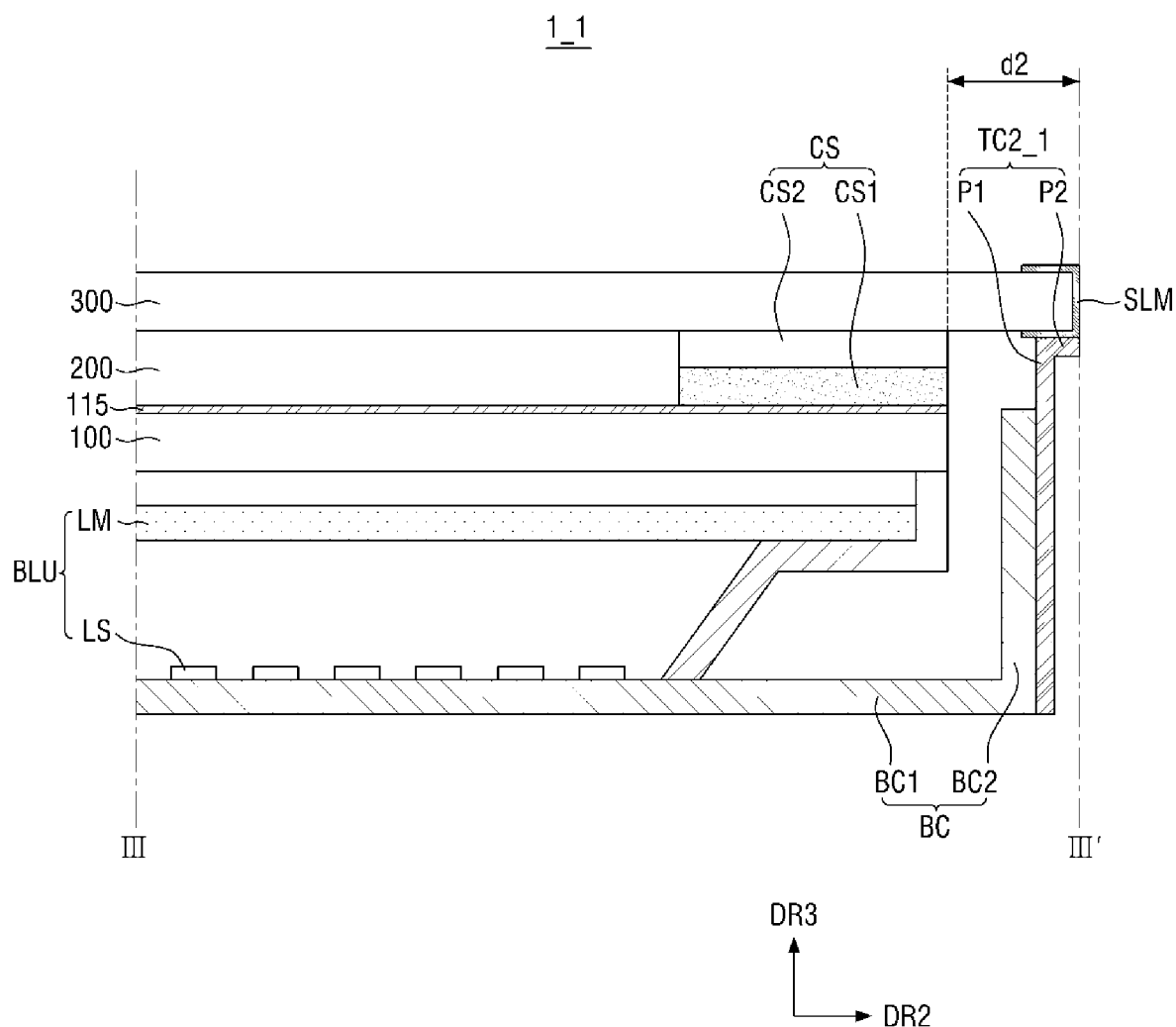
FIG. 15 is a cross-sectional view of a display device according to some example embodiments of the present disclosure, taken along the line III-III' of FIG. 2.
Figure 16:
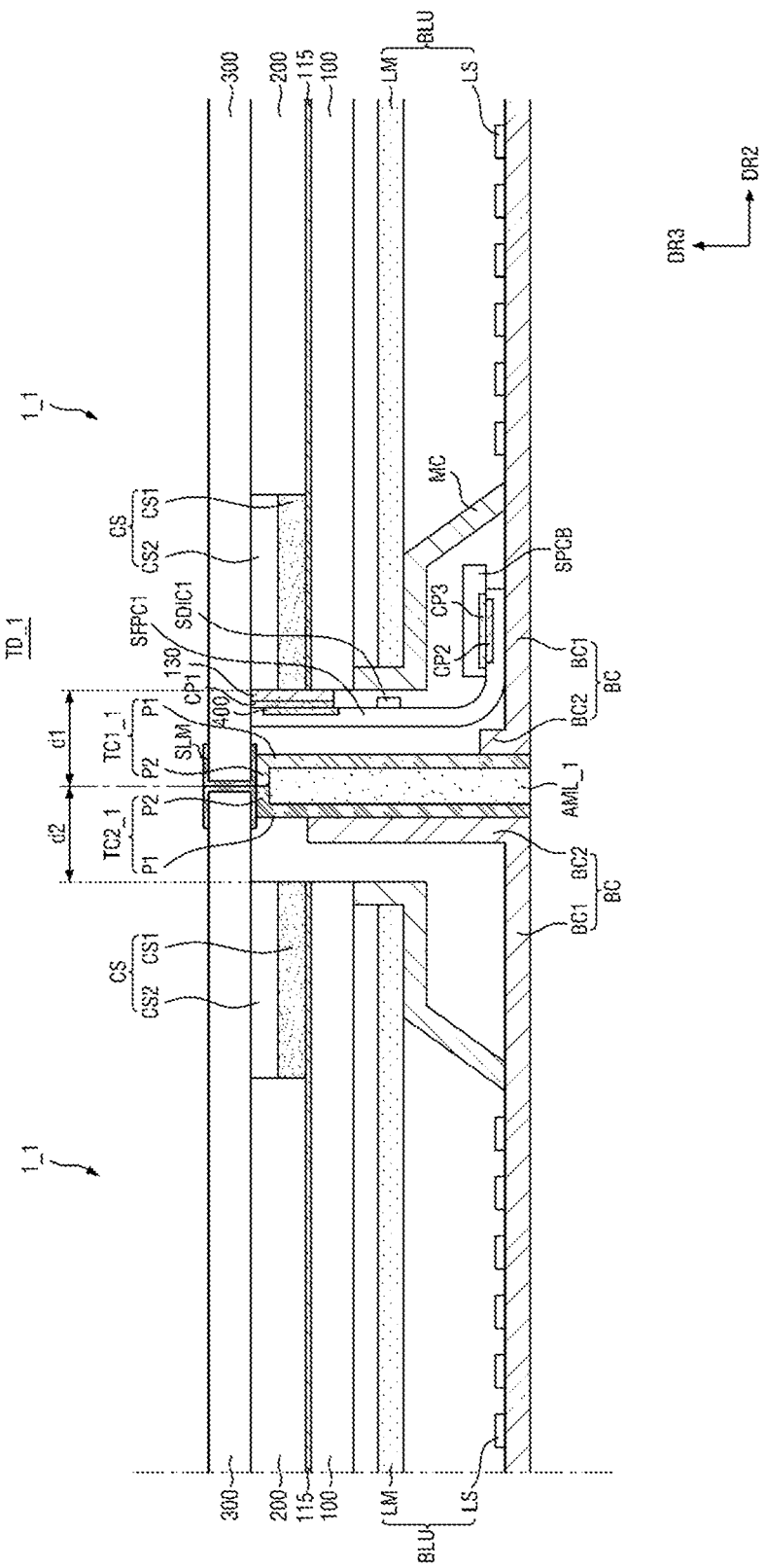
FIG. 16 is a cross-sectional view schematically showing a connection portion where display devices of a tiled display apparatus according to some example embodiments of the present disclosure are connected to each other.

FIG. 14 is a cross-sectional view of a display device according to some example embodiments of the present disclosure, taken along the line II-II' of FIG. 2. FIG. 15 is a cross-sectional view of a display device according to some example embodiments, taken along the line III-III' of FIG. 2. FIG. 16 is a cross-sectional view schematically showing a connection portion where display devices of a tiled display apparatus according to some example embodiments of the present disclosure are connected to each other. The example embodiment of FIGS. 14 to 16 is different from the example embodiments of FIGS. 6, 7 and 13 in that each of cover members TC1_1 and TC2_1 includes a first portion P1 and a second portion P2. Description will focus on differences, and the redundant description will be omitted.

Referring to FIGS. 14 to 16, each of the first cover member TC1_1 and the second cover member TC2_1 may include the first portion P1 and the second portion P2.

The first portion P1 of the first cover member TC1_1 may be extended in the third direction DR3, and the second portion P2 may be extended in the opposite direction to the second direction DR2 from the upper end of the first portion P1. In addition, the first portion P1 of the second cover member TC2_1 may be extended in the third direction DR3, and the second portion P2 may be extended in the second direction DR2 from the upper end of the first portion P1.

The first portion P1 of each of the first cover member TC1_1 and the second cover member TC2_1 may be coupled and fixed to the sidewall BC2 of the bottom cover BC.

The second portion P2 of each of the first cover member TC1_1 and the second cover member TC2_1 may not be in line with the sidewall BC2 of the bottom cover BC in the third direction DR3, while may be coupled and fixed to the light-blocking member SLM of the second substrate 300. It is, however, to be understood that the present disclosure is not limited thereto. In some example embodiments, the second portion P2 of each of the first cover member TC1_1 and the second cover member TC2_1 may be coupled and fixed to the second substrate 300. In some example embodiments, the second portion P2 of each of the first cover member TC1_1 and the second cover member TC2_1 may be coupled and fixed to the light-blocking member SLM and the second substrate 300.

As such, each of the first cover member TC1_1 and the second cover member TC2_1 further includes the second portion P2, the first cover member TC1_1 and the second cover member TC2_1 can be coupled with the second substrate 300 more stably.

In addition, for a tiled display apparatus TD_1 implemented by connecting the individual display devices 1_1 with one another by a coupling member AML_1, the second portions P2 of the first cover members TC1_1 and the second cover members TC2_1 of the individual display devices 1_1 are in contact with one another to form the more robust structure, thereby improving the reliability of the tiled display apparatus TD_2.

Figure 17:
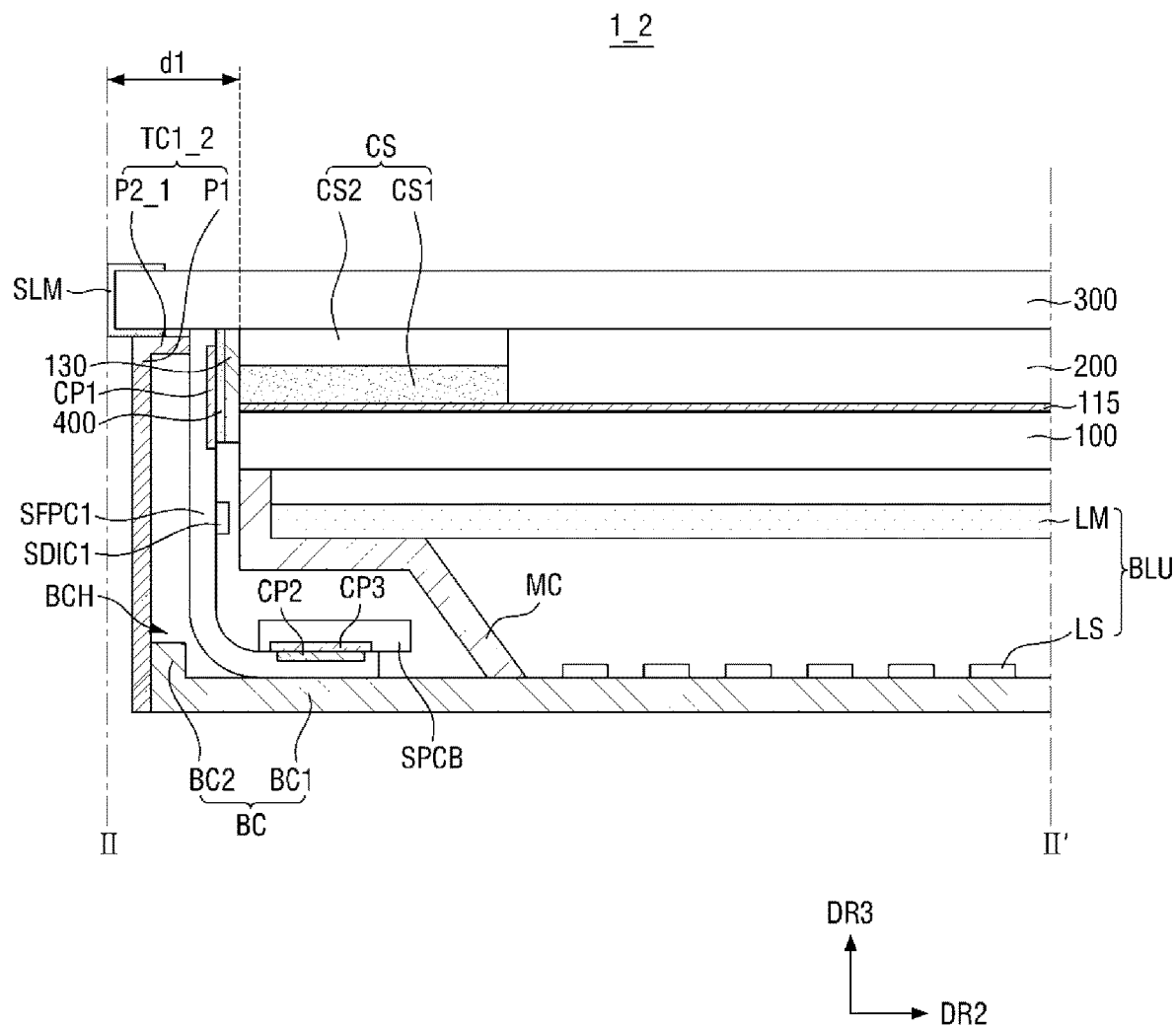
FIG. 17 is a cross-sectional view of a display device according to some example embodiments of the present disclosure, taken along the line II-II' of FIG. 2.
Figure 18:
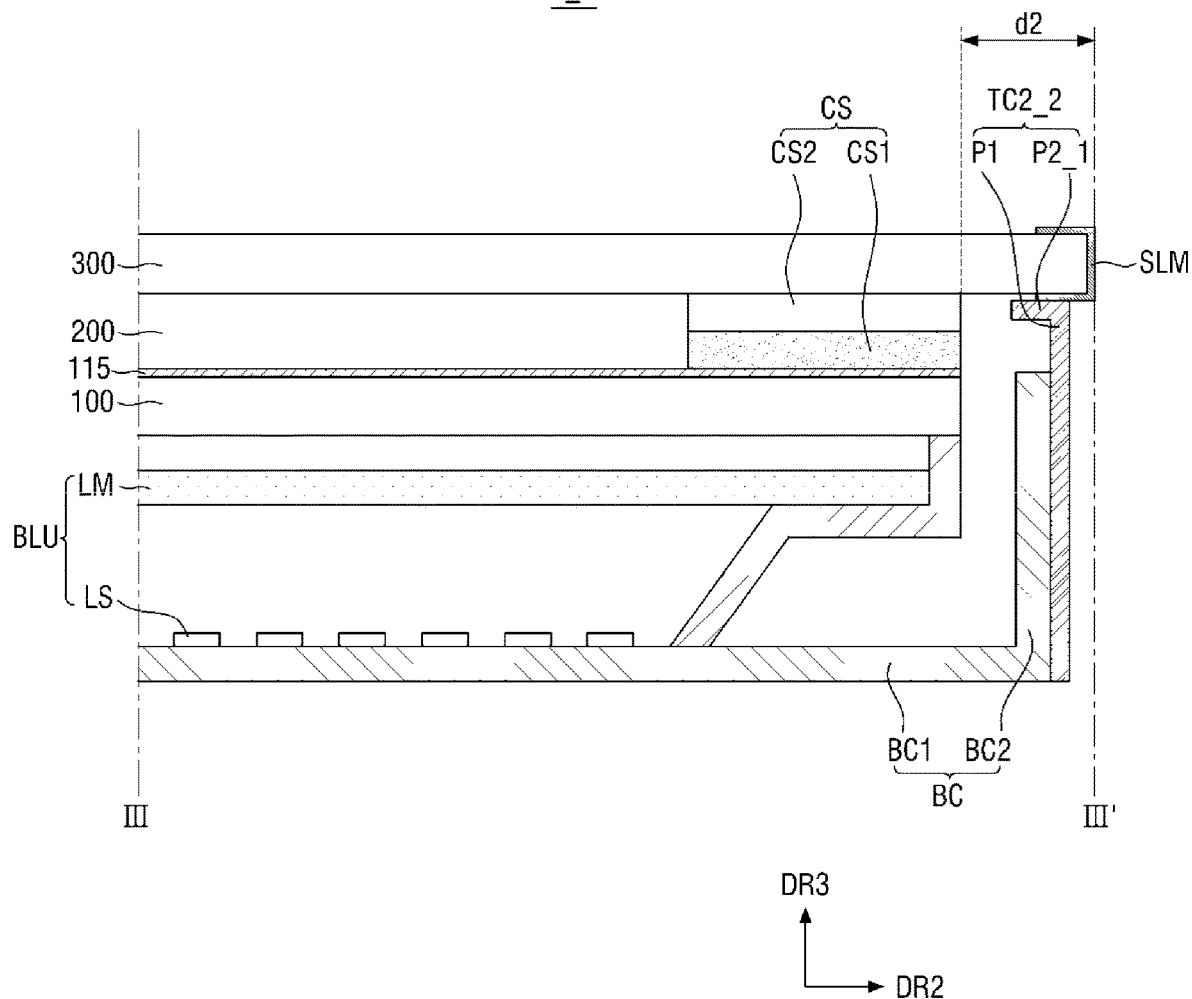
FIG. 18 is a cross-sectional view of a display device according to some example embodiments of the present disclosure, taken along the line III-III' of FIG. 2.
Figure 19:
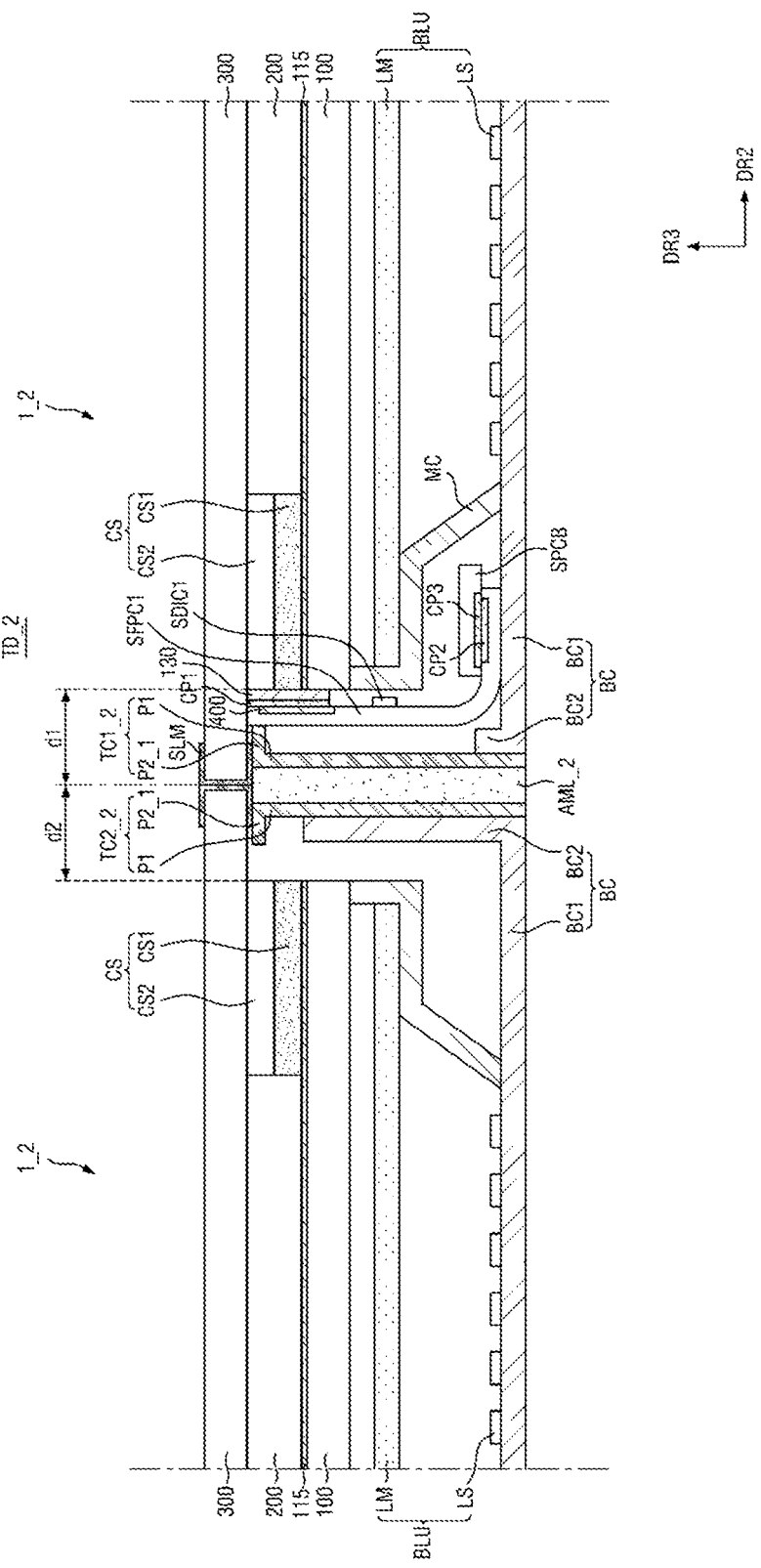
FIG. 19 is a cross-sectional view schematically showing a connection portion where display devices of a tiled display apparatus according to some example embodiments of the present disclosure are connected to each other.

FIG. 17 is a cross-sectional view of a display device according to some example embodiments of the present disclosure, taken along the line II-II' of FIG. 2. FIG. 18 is a cross-sectional view of a display device according to some example embodiments, taken along the line III-III' of FIG. 2. FIG. 19 is a cross-sectional view schematically showing a connection portion where display devices of a tiled display apparatus according to some example embodiments of the present disclosure are connected to each other. The example embodiment of FIGS. 17 to 19 is different from the example embodiments of FIGS. 6, 7 and 13 in that each of cover members TC1_2 and TC2_2 includes a first portion P1 and a second portion P2_1. Description will focus on differences, and the redundant description will be omitted.

Referring to FIGS. 14 to 16, each of the first cover member TC1_2 and the second cover member TC2_2 may include the first portion P1 and the second portion P2_1.

The first portion P1 of the first cover member TC1_2 may be extended in the third direction DR3, and the second portion P2_1 may be extended in the second direction DR2 from the upper end of the first portion P1. In addition, the first portion P1 of the second cover member TC2_2 may be extended in the third direction DR3, and the second portion P2_1 may be extended in the opposite direction to the second direction DR2 from the upper end of the first portion P1.

The first portion P1 of each of the first cover member TC1_2 and the second cover member TC2_2 may be coupled and fixed to the sidewall BC2 of the bottom cover BC.

The second portion P2_1 of each of the first cover member TC1_2 and the second cover member TC2_2 may overlap the sidewall BC2 of the bottom cover BC, while may be coupled and fixed to the light-blocking member SLM of the second substrate 300. It is, however, to be understood that the present disclosure is not limited thereto. In some example embodiments, the second portion P2 of each of the first cover member TC1_1 and the second cover member TC2_1 may be coupled and fixed to the second substrate 300. In some example embodiments, the second portion P2 of each of the first cover member TC1_1 and the second cover member TC2_1 may be coupled and fixed to the light-blocking member SLM and the second substrate 300.

The second portion P2_1 of the first cover member TC1_2 may be spaced apart from the flexible circuit board SFPC1 in the second direction DR2, but the present disclosure is not limited thereto. The second portion P2_1 of the first cover member TC1_2 may be in contact with the flexible circuit board SFPC1 so that the flexible circuit board SFPC1 can be coupled with the side surface of the first substrate 100 more reliably.

The second portion P2_1 of the second cover member TC2_2 may be spaced apart from the side surface of the second spacer CS2 in the second direction DR2. It is, however, to be understood that the present disclosure is not limited thereto. The second portion P2_1 of the second cover member TC2_2 may be in contact with the side surface of the second spacer CS2, and the second portion P2_1 of the second cover member TC2_2 may not be in contact with the side surface of the second spacer CS2_2 and may be extended further in the opposite direction to the second direction DR2.

As such, each of the first cover member TC1_2 and the second cover member TC2_2 further includes the second portion P2_1, the first cover member TC1_2 and the second cover member TC2_2 can be coupled with the second substrate 300 more stably.

In addition, by implementing the tiled display apparatus TD_2 by connecting the individual display devices 1_2 by the coupling member AML_2, the adhesion area of the coupling member AML_2 can be further increased compared with the example shown in FIGS. 14 to 16, so that the reliability of the tiled display apparatus TD_2 can be improved.

Figure 20:
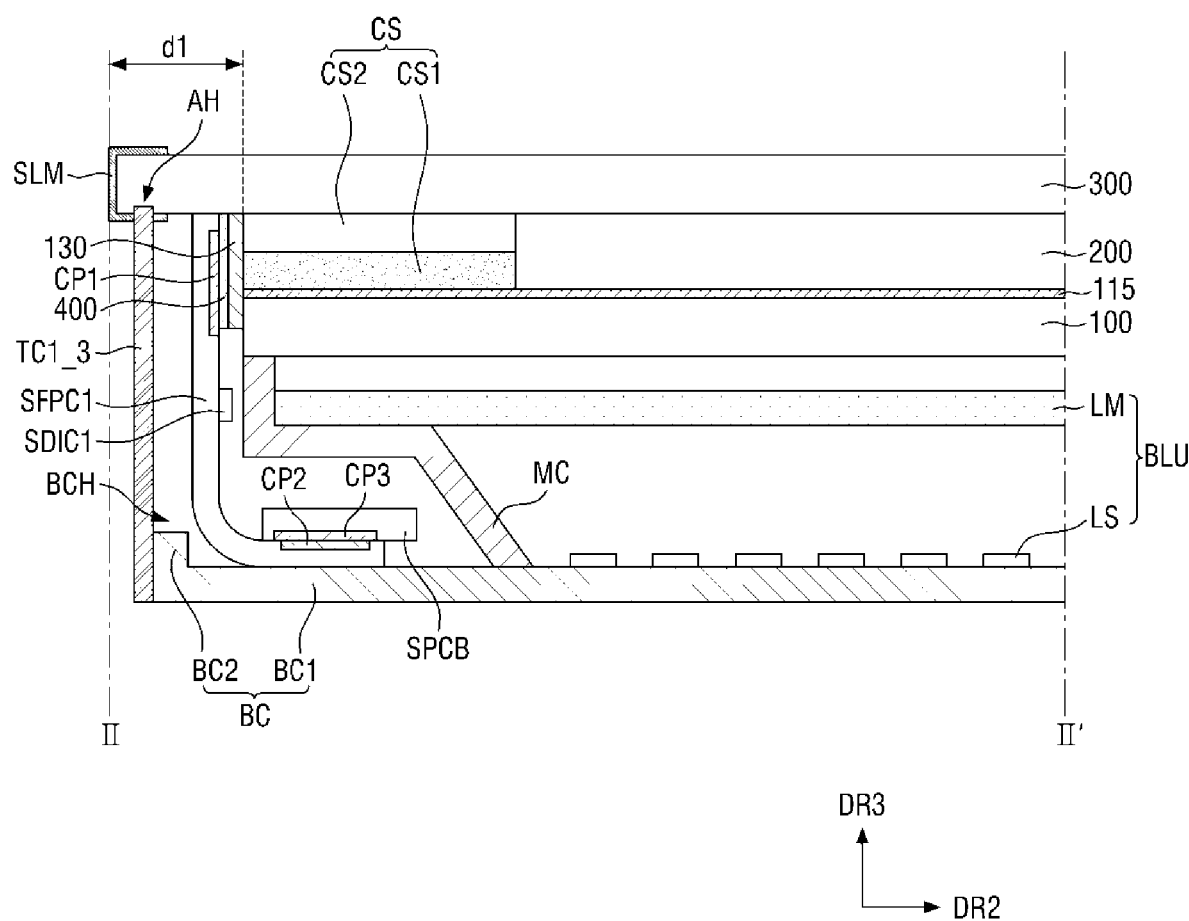
FIG. 20 is a cross-sectional view of a display device according to some example embodiments of the present disclosure, taken along the line II-II' of FIG. 2.
Figure 21:
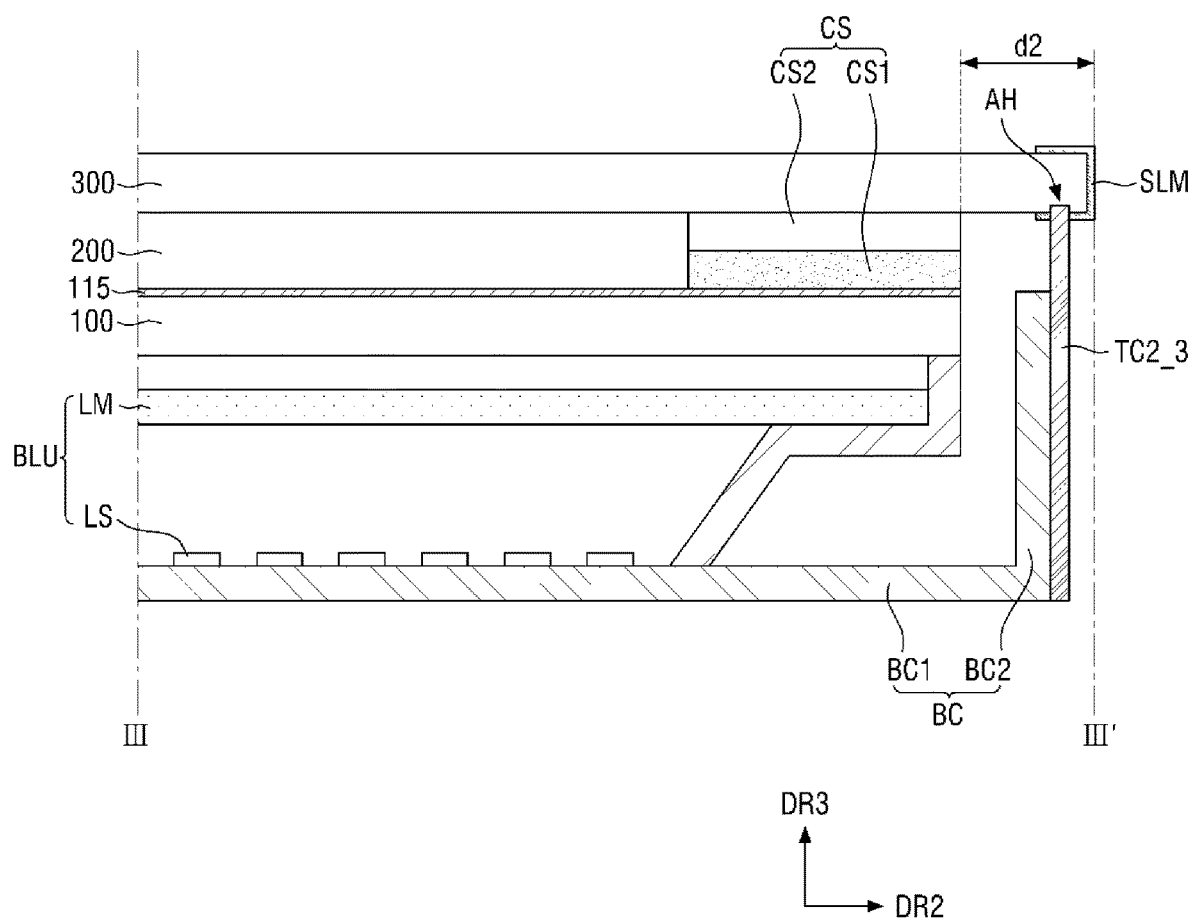
FIG. 21 is a cross-sectional view of a display device according to some example embodiments of the present disclosure, taken along the line III-III' of FIG. 2.
Figure 22:
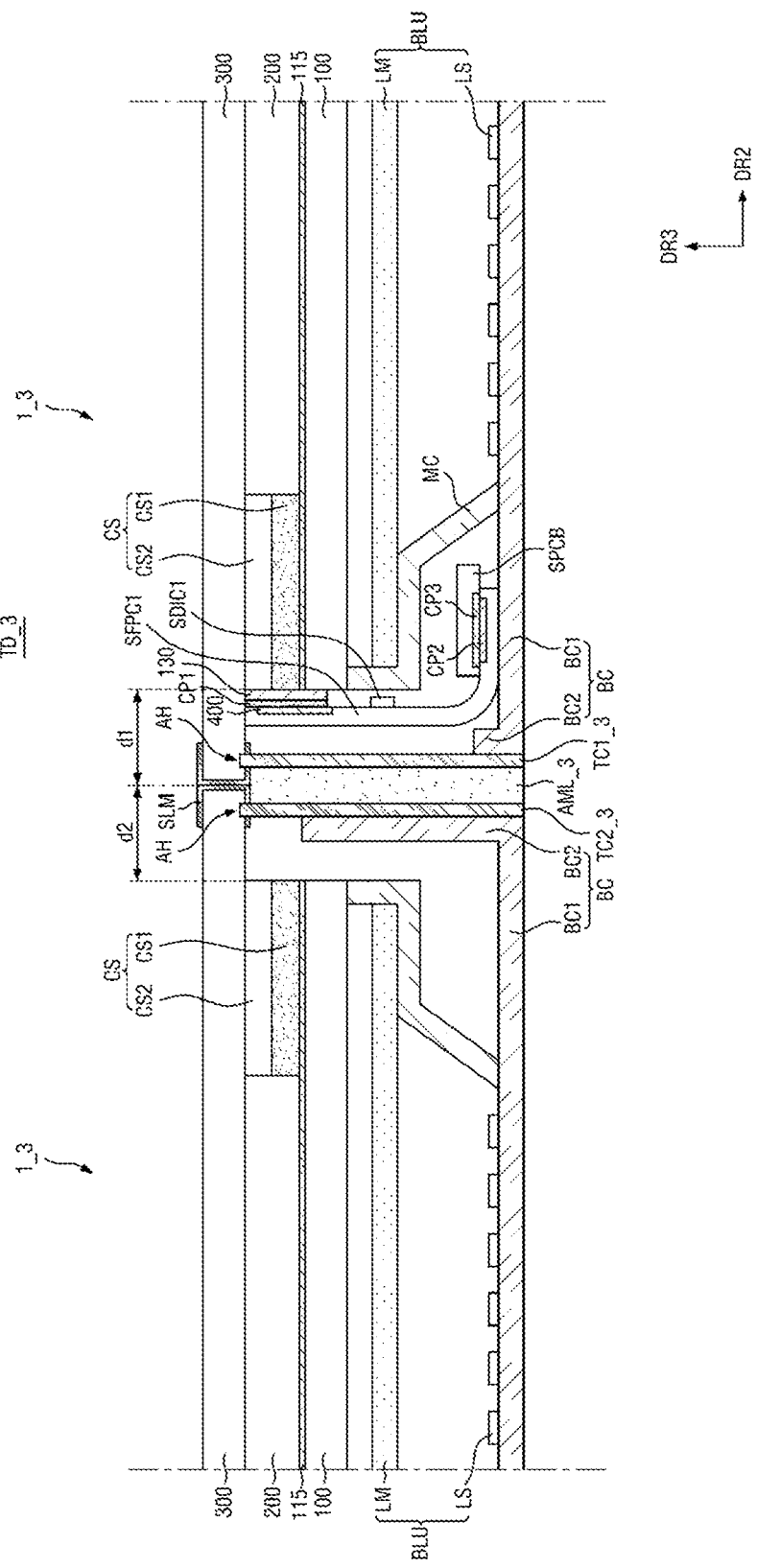
FIG. 22 is a cross-sectional view schematically showing a connection portion where display devices of a tiled display apparatus according to some example embodiments of the present disclosure are connected to each other.

FIG. 20 is a cross-sectional view of a display device according to some example embodiments of the present disclosure, taken along the line II-II' of FIG. 2. FIG. 21 is a cross-sectional view of a display device according to some example embodiments, taken along the line III-III' of FIG. 2. FIG. 22 is a cross-sectional view schematically showing a connection portion where display devices of a tiled display apparatus according to some example embodiments of the present disclosure are connected to each other. The example embodiment of FIGS. 20 to 22 is different from the example embodiments of FIGS. 6, 7 and 13 in that a part of each of cover members TC1_3 and TC2_3 is inserted into a second substrate 300. Description will focus on differences, and the redundant description will be omitted.

Referring to FIGS. 20 to 22, the second substrate 300 may include an accommodating groove AH. For example, the accommodating groove AH may be formed in a portion of the second substrate 300 that does not overlap with the first substrate 100 in the third direction DR3. Further, a light-blocking member SLM may be positioned along or around the accommodating groove AH.

The upper end of each of the first cover member TC1_3 and the second cover member TC2_3 may be inserted into the accommodating groove AH of the second substrate 300. The accommodating groove AH may have a shape conforming to the upper end of each of the first cover member TC1_3 and the second cover member TC2_3 and may be formed larger than the upper end of each of the first cover member TC1_3 and the second cover member TC2_3 so that the upper end can be inserted into it.

The lower end of the first cover member TC1_3 and the second cover member TC2_3 can be coupled and fixed to the sidewall BC2 of the bottom cover BC, and the upper end of each of the first cover member TC1_3 and the second cover member TC2_3 may be coupled and fixed to the accommodating groove AH of the second substrate 300. In some example embodiments, an adhesive member may be positioned between the upper end of each of the first cover member TC1_3 and the second cover member TC2_3 and the accommodating groove AH. In such case, the adhesive member may include a light-blocking material.

As such, the upper end of each of the first cover member TC1_3 and the second cover member TC2_3 is inserted into the accommodating groove AH of the second substrate 300, the first cover member TC1_1 and the second cover member TC2_1 can be coupled with the second substrate 300 more stably.

In addition, by implementing the tiled display apparatus TD_3 by connecting the individual display devices 1_3 by the coupling member AML_3, the adhesion area of the coupling member AML_3 can be further increased compared with the example shown in FIGS. 14 to 16, so that the reliability of the tiled display apparatus TD_3 can be improved.

Further, because the second substrate 300 includes the accommodating groove AH, it is easier to align the cover members TC1_3 and TC2_3 with the second substrate 300 and is more convenient to position them on the second substrate 300.

Figure 23:
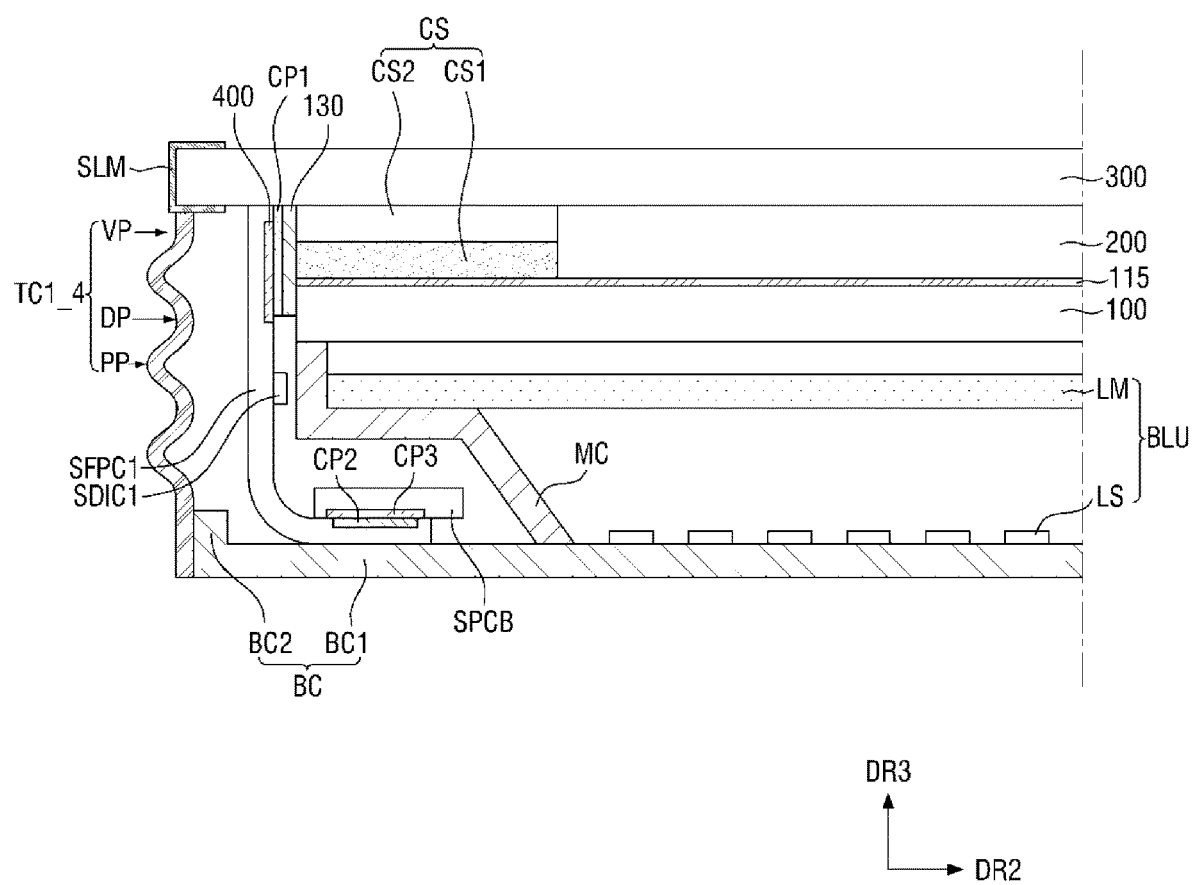
FIG. 23 is a cross-sectional view of a display device according to some example embodiments of the present disclosure, taken along the line II-II' of FIG. 2.
Figure 24:
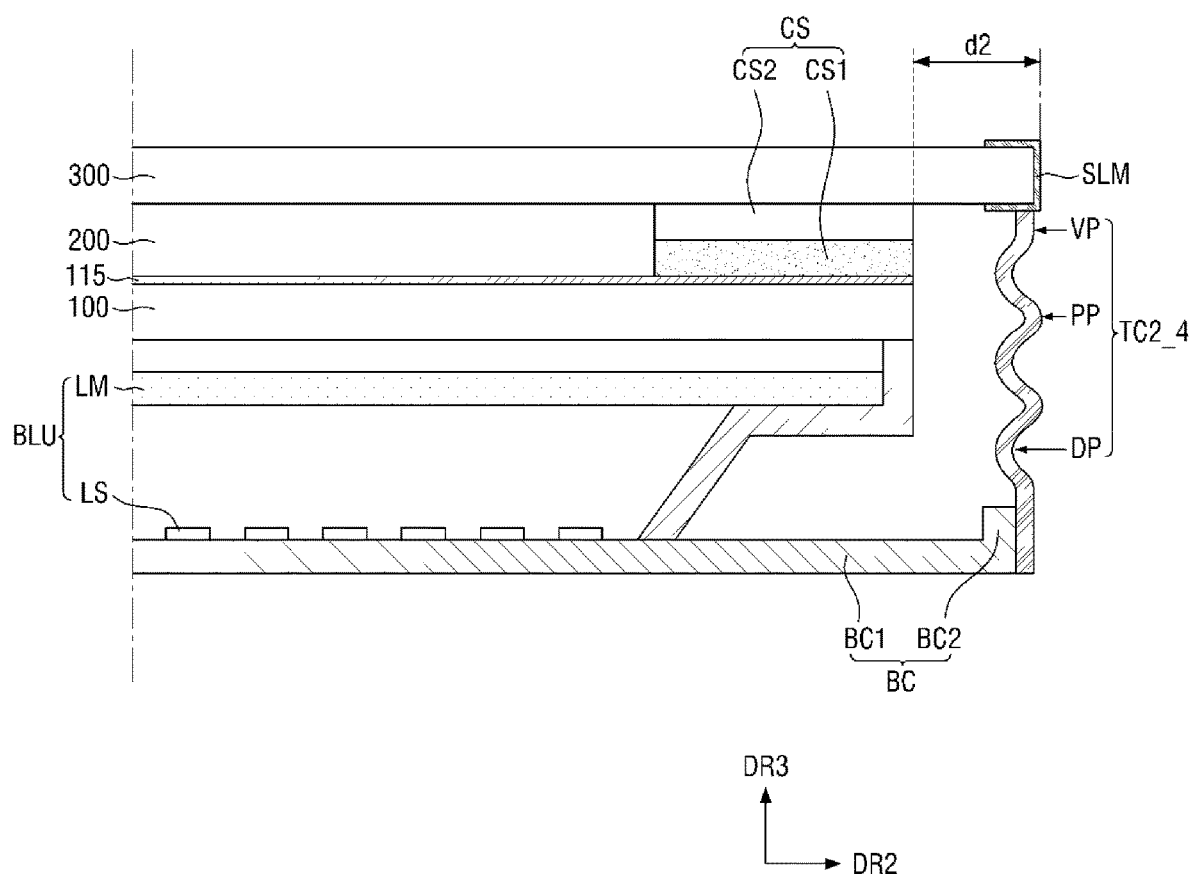
FIG. 24 is a cross-sectional view of a display device according to some example embodiments of the present disclosure, taken along the line III-III' of FIG. 2.
Figure 25:
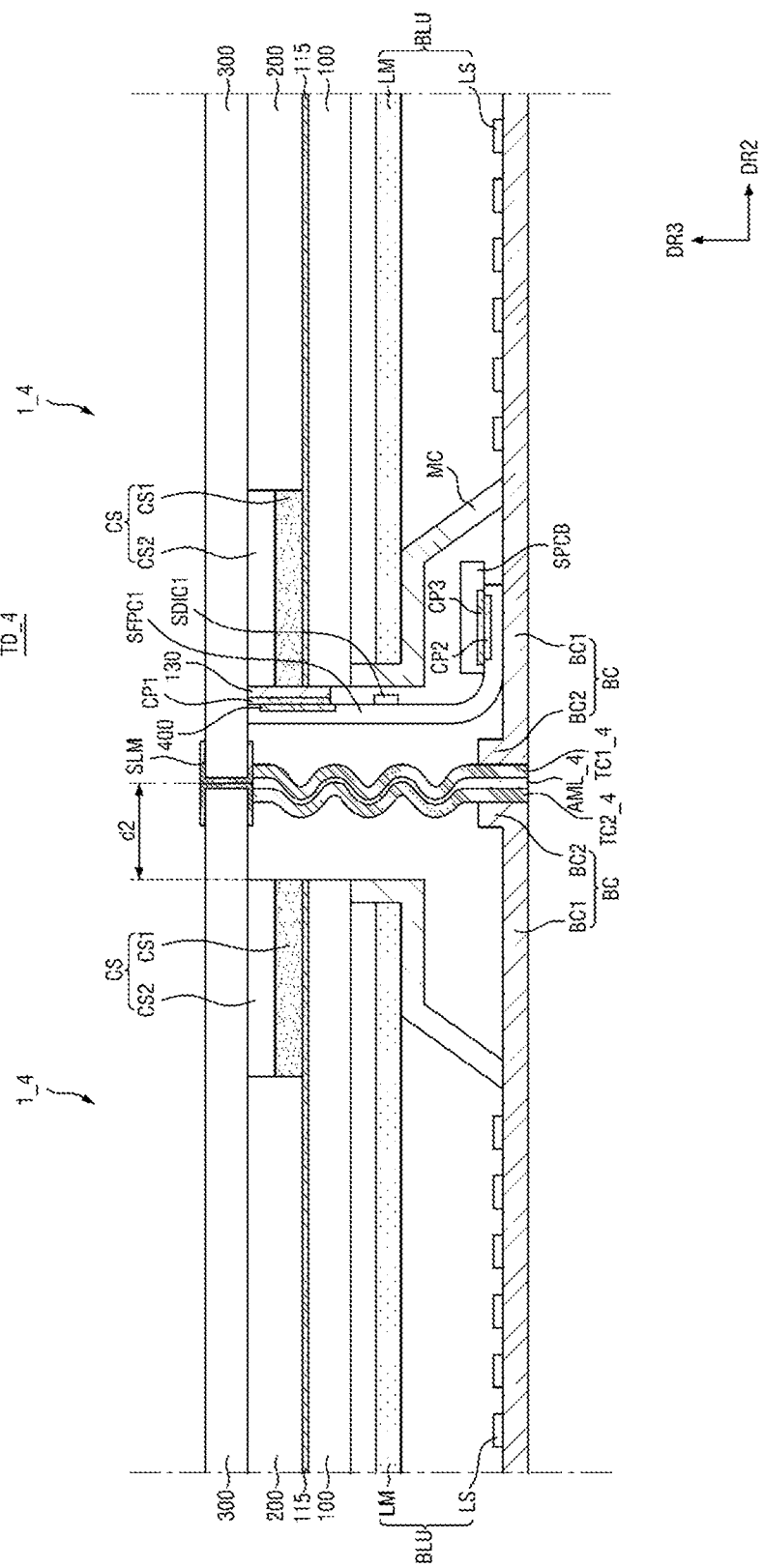
FIG. 25 is a cross-sectional view schematically showing a connection portion where display devices of a tiled display apparatus according to some example embodiments of the present disclosure are connected to each other.

FIG. 23 is a cross-sectional view of a display device according to some example embodiments of the present disclosure, taken along the line II-II' of FIG. 2. FIG. 24 is a cross-sectional view of a display device according to some example embodiments, taken along the line III-III' of FIG. 2. FIG. 25 is a cross-sectional view schematically showing a connection portion where display devices of a tiled display apparatus according to some example embodiments of the present disclosure are connected to each other. The example embodiment of FIGS. 23 to 25 is different from the example embodiments of FIGS. 6, 7 and 13 in that each of cover members TC1_4 and TC2_4 includes protruding portions PP and depressed portions DP. Description will focus on differences, and the redundant description will be omitted.

Referring to FIGS. 23 to 25, each of the first cover member TC1_1 and the second cover member TC2_1 may include vertical portions VP, protruding portions PP and depressed portions DP.

The vertical portions VP extended in the third direction DR3 may be positioned at the upper end and the lower end of each of a first cover member TC1_4 and a second cover member TC2_4, respectively, which are coupled with the second substrate 300. In addition, sidewalls BC2 of the bottom cover BC to which the first cover member TC1_4 and the second cover member TC2_4 are respectively coupled may have the same length.

The protruding portions PP and depressed portions DP of the first cover member TC1_4 and the second cover member TC2_4 are positioned between the vertical portion VP positioned at the upper end and the vertical portion VP positioned at the lower end. The protruding portions PP and the depressed portions DP may be alternately arranged in the third direction DR3. As such, each of the first cover member TC1_4 and the second cover member TC2_4 includes the protruding portions PP and the depressed portions DP, it is possible to buffer effect of the display device 1_4. As a result, there is an advantage that breakage or damage of the display device 1_5 due to external force can be prevented.

In some example embodiments, the protruding portions PP of the first cover member TC1_4 may protrude in the opposite direction to the second direction DR2. The depressed portions DP of the first cover member TC1_4 may protrude in the second direction DR2. The protruding portions PP of the second cover member TC2_4 may protrude in the second direction DR2. The depressed portions DP of the second cover member TC2_4 may protrude in the opposite direction to the second direction DR2.

As such, the protruding portions PP of the first cover member TC1_4 may conform to the depressed portions of the second cover member TC2_4, while the depressed portions of the first cover member TC1_4 may conform to the protruding portions PP of the second cover member TC2_4. Accordingly, when the tiled display apparatus TD_4 is implemented by connecting the individual display devices 1_4 by the coupling member AML_4, the protruding portions PP of the first cover member TC1_4 are inserted into the depressed portions DP of the second cover member TC2_4 with the coupling member AML_4 therebetween, while the protruding portions PP of the second cover member TC2_4 are inserted into the depressed portions DP of the first cover member TC1_4 with the coupling member AML_4 therebetween. As a result, it is possible to increase the buffer effect of the tiled device apparatus TD_4 and to implement a more robust structure.

Figure 26:
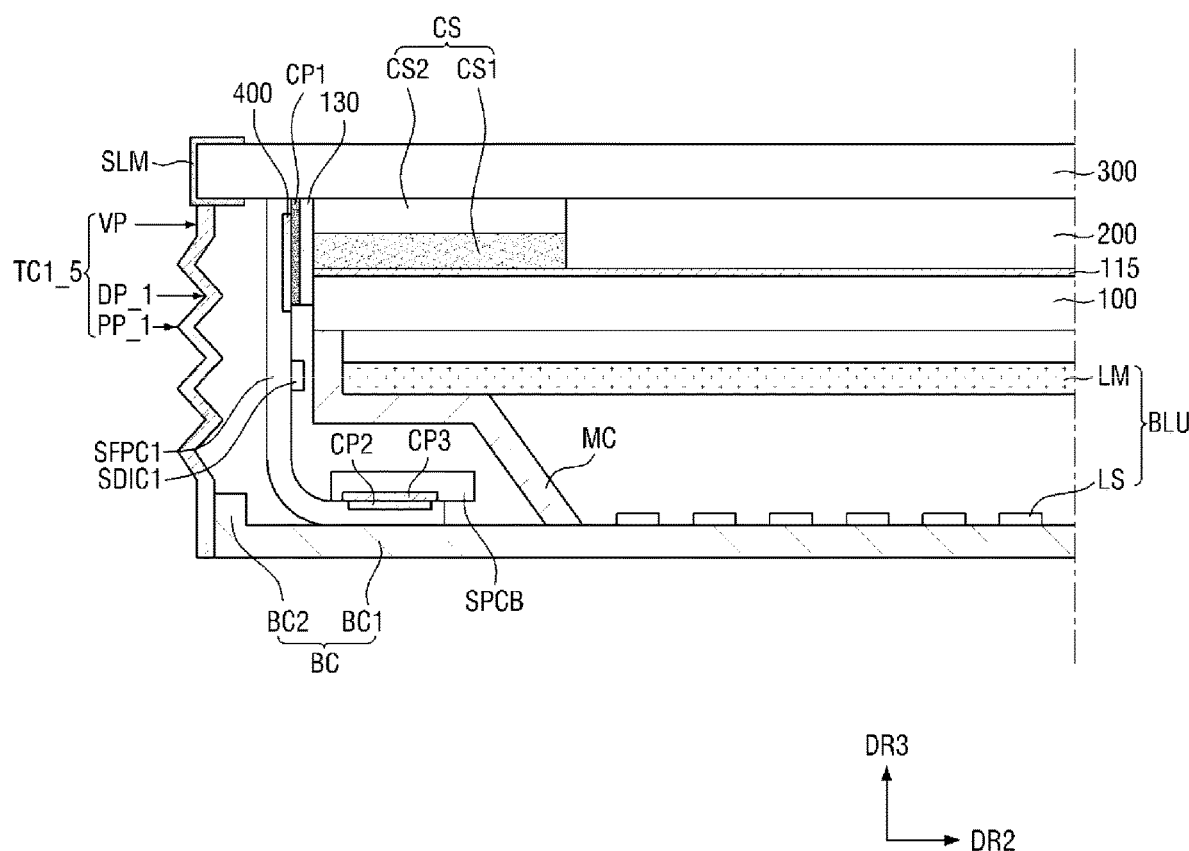
FIG. 26 is a cross-sectional view of a display device according to some example embodiments of the present disclosure, taken along the line II-II' of FIG. 2.
Figure 27:
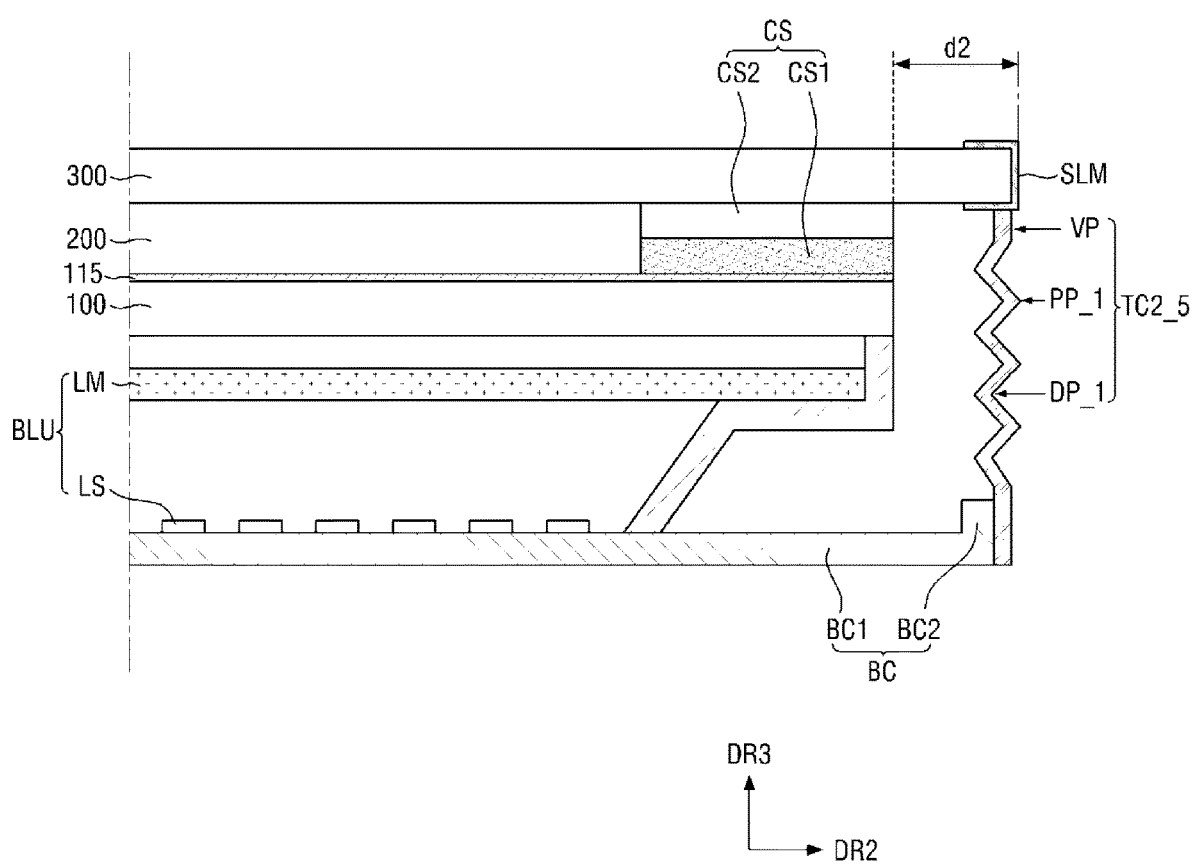
FIG. 27 is a cross-sectional view of a display device according to some example embodiments of the present disclosure, taken along the line III-III' of FIG. 2.
Figure 28:
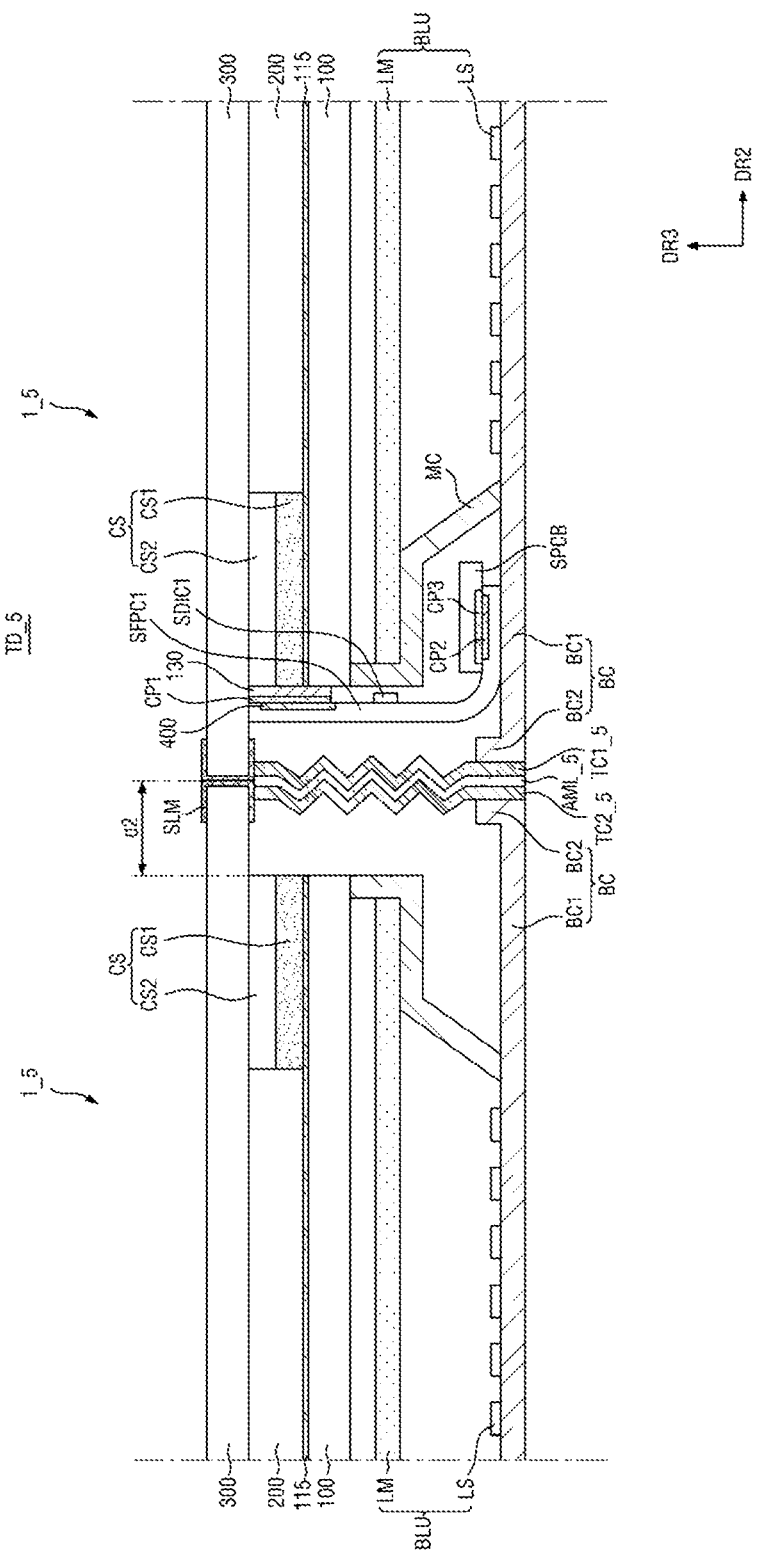
FIG. 28 is a cross-sectional view schematically showing a connection portion where display devices of a tiled display apparatus according to some example embodiments of the present disclosure are connected to each other.

FIG. 26 is a cross-sectional view of a display device according to some example embodiments of the present disclosure, taken along the line II-II' of FIG. 2. FIG. 27 is a cross-sectional view of a display device according to some example embodiments, taken along the line III-III' of FIG. 2. FIG. 28 is a cross-sectional view schematically showing a connection portion where display devices of a tiled display apparatus according to some example embodiments of the present disclosure are connected to each other. The example embodiment of FIGS. 26 to 28 is different from the example embodiment of FIGS. 23 to 25 in that protruding portions PP_1 and depressed portions DP_1 of each of cover members TC1_5 and TC2_5 have different shapes. Description will focus on differences, and the redundant description will be omitted.

Referring to FIGS. 26 to 28, each of the first cover member TC1_5 and the second cover member TC2_5 may include vertical portions VP, protruding portions PP_1 and depressed portions DP_1.

The protruding portions PP_1 and the depressed portions DP_1 of the first cover member TC1_5 and the second cover member TC2_5 may be arranged in a zigzag shape in which ridges and valleys are alternately arranged. As each of the first cover member TC1_5 and the second cover member TC2_5 includes the protruding portions PP_1 and the depressed portions DP_1 in the zigzag shape, it is possible to improve buffer effect of the display device 1_5. As a result, there is an advantage that breakage or damage of the display device 1_5 due to external force can be prevented.

In some example embodiments, the protruding portions PP_1 of the first cover member TC1_5 may be ridges protruding in the opposite direction to the second direction DR2. The depressed portions DP_1 of the first cover member TC1_5 may be valleys protruding in the second direction DR2. The protruding portions PP_1 of the second cover member TC2_5 may be ridges protruding in the second direction DR2. The depressed portions DP_1 of the second cover member TC2_5 may be valleys protruding in the opposite direction to the second direction DR2.

As such, the protruding portions PP_1 of the first cover member TC1_5 may conform to the depressed portions DP_1 of the second cover member TC2_5, while the depressed portions DP_1 of the first cover member TC1_5 may conform to the protruding portions PP_1 of the second cover member TC2_5. Accordingly, when the tiled display apparatus TD_5 is implemented by connecting the individual display devices 1_5 by the coupling member AML_5, the protruding portions PP_1 of the first cover member TC1_5 are inserted into the depressed portions DP_1 of the second cover member TC2_5 with the coupling member AML_5 therebetween, while the protruding portions PP_1 of the second cover member TC2_5 are inserted into the depressed portions DP_1 of the first cover member TC1_5 with the coupling member AML_5 therebetween. As a result, it is possible to increase the buffer effect of the tiled device apparatus TD_5 and to implement a more robust structure.

Moreover, as the protruding portions PP_1 and the depressed portions DP_1 of each of the first cover member TC1_5 and the second cover member TC2_5 having the zigzag shape, the protruding portions PP_1 and the depressed portions DP_1 can be more easily coupled with one another compared with the example shown in FIGS. 23 to 25.

Figure 29:
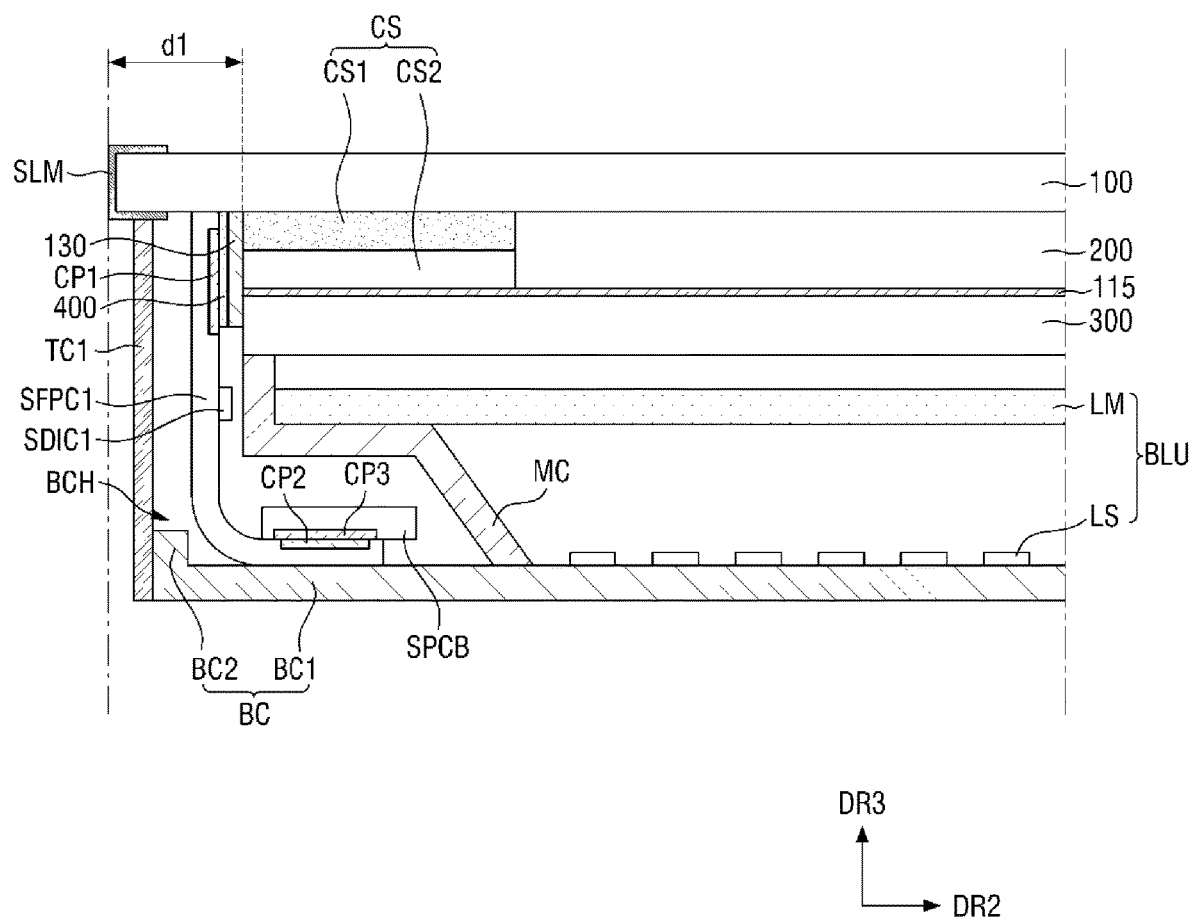
FIG. 29 is a cross-sectional view of a display device according to some example embodiments of the present disclosure, taken along the line II-II' of FIG. 2.
Figure 30:
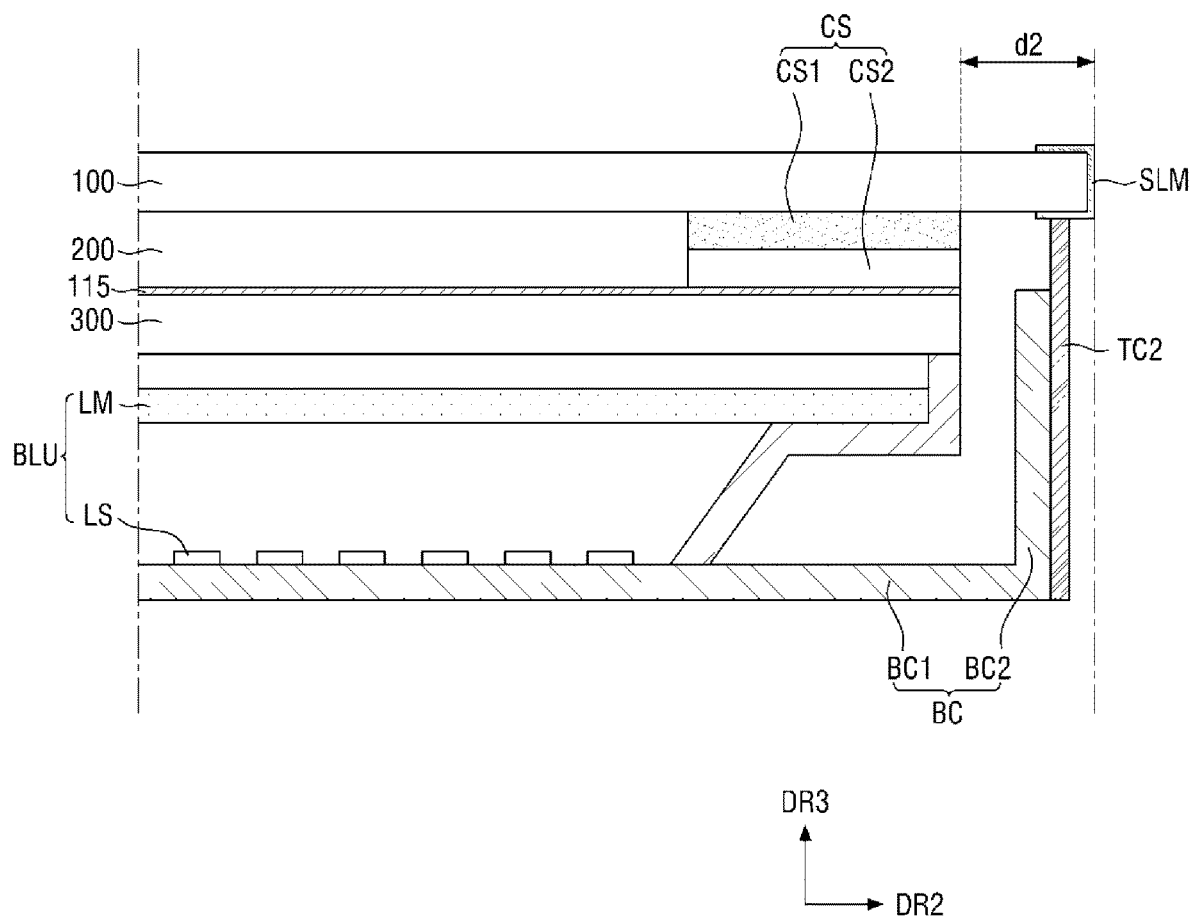
FIG. 30 is a cross-sectional view of a display device according to some example embodiments of the present disclosure, taken along the line III-III' of FIG. 2.

FIG. 29 is a cross-sectional view of a display device according to some example embodiments of the present disclosure, taken along the line II-II' of FIG. 2. FIG. 30 is a cross-sectional view of a display device according to some example embodiments, taken along the line III-III' of FIG. 2. The embodiments of FIGS. 29 and 30 are different from the example embodiment of FIGS. 6 and 7 in that a first substrate, which is a TFT substrate, is positioned on a second substrate which is a color filter substrate. Description will focus on differences, and the redundant description will be omitted.

Referring to FIG. 29, in a display device 1_6 according to some example embodiments, a first substrate 100 may be positioned on a second substrate 300. The first substrate 100 may be a TFT substrate, and the second substrate 300 may be a color filter substrate. The second substrate 300 may be positioned under the first substrate 100 and may recede from the first substrate 100 in the second direction DR2 by a first distance d1. For example, the second substrate 300 may be cut by the first distance d1. As described above, the first distance d1 may range, but is not limited to, from 0.3 mm to 0.5 mm. The elements may not be positioned on the part of the first substrate 100 that protrudes from the second substrate 300. Only the glass of the second substrate 300 and the light-blocking member SLM may be positioned on the protruding part of first substrate 100.

An interconnect 115 may be located on the second substrate 300. A flexible circuit board SFPC1 connected to one side of the second substrate 300 by an outer lead bonding (OLB) may be positioned.

A liquid-crystal layer 200 and a spacer CS_1 may be positioned between the first substrate 100 and the second substrate 300. The spacer CS_1 may include a first spacer CS1 and a second spacer CS2. For example, the first spacer CS1 and the second spacer CS2 may be aligned with the end of the first substrate 100 in the third direction DR3. It is, however, to be understood that the present disclosure is not limited thereto. In some example embodiments, only one of the first spacer CS1 and the second spacer CS2 may be aligned with the end of the first substrate 100 in the third direction DR3.

The first spacer CS1 may be located between the first substrate 100 and the second substrate 300, and the second spacer CS2 may be located between the first spacer CS1 and the second substrate 300. The first spacer CS1 may include a blue colorant.

The connection pad 130 may be positioned on the side surfaces of the second substrate 300, the interconnect 115, the first spacer CS1 and the second spacer CS2 and under the first substrate 100. In addition, the upper end of the flexible circuit board SFPC1 connected to the connection pad 130 may be located on one side surface of the second substrate 300 and under the first substrate 100, while the driver circuit board SPCB and the lower end of the flexible circuit board SFPC1 connected to the driver circuit board SPCB may be bent over below the second substrate 300. As such, the second substrate 300 recedes from the first substrate 100 in the second direction DR2 by the first distance d1, and thus the connection pad 130 and the flexible circuit board SFPC1 connected to the connection pad 130 can be located below the first substrate 100.

The first cover member TC1 may be positioned on the outer side of the flexible circuit board SFPC1 and under the first substrate 100. Specifically, the first cover member TC1 may be located on the opposite side of the flexible circuit board SFPC1 in the second direction DR2, and may overlap the first substrate 100 in the third direction DR3.

A light-blocking member SLM for preventing light leakage may be positioned on a corner and a side surface of the first substrate 100. The upper end of the first cover member TC1 may be adhered and fixed to the light-blocking member SLM by an adhesive member. It is, however, to be understood that the present disclosure is not limited thereto. The upper end of the first cover member TC1 may be adhered and fixed to the first substrate 100 by an adhesive member.

The first cover member TC1 may not be in line with one side surface of the first substrate 100 in the third direction DR3. For example, the first cover member TC1 may be moved in the second direction DR2 from the side surface of the first substrate 100. As such, when the first cover member TC1 is moved in the second direction DR2 from the side surface of the second substrate 100 as described above, there is an advantage that a space for coupling the cover members TC can be formed under the first substrate 100 when the tiled display apparatus TD is implemented. Accordingly, it is possible to prevent the bezel from being increased due to the space for coupling. It is, however, to be understood that the present disclosure is not limited thereto. The first cover member TC1 may be aligned with the side surface of the first substrate 100 in the third direction DR3.

Referring to FIG. 30, the second substrate 300 may recedes from the first substrate 100 in the opposite direction to the second direction DR2 by a second distance d2. For example, the second substrate 300 may be cut by the second distance d2. The first substrate 100 may be a TFT substrate, and the second substrate 300 may be a color filter substrate. The second distance d2 may be equal to the first distance d1. For example, the second distance d2 may range, but is not limited to, from 0.3 mm to 0.5 mm. In some example embodiments, the second distance d2 may be smaller than the first distance d1 because the flexible circuit board SFPC1 is not present.

The liquid-crystal layer 200, the first spacer CS1 and the second spacer CS2 surrounding the liquid-crystal layer 200 may be positioned between the second substrate 300 and the first substrate 100.

The second cover member TC2 may be spaced apart from the side surface of the second substrate 300 in the second direction DR2 and may be located under the first substrate 100. Specifically, the upper end of the second cover member TC2 may be adhered and fixed to the light-blocking member SLM by an adhesive member, and the side surface of the second cover member TC2 may be coupled with the sidewall BC2 of the bottom cover BC.

The second cover member TC2 may not be in line with one side surface of the first substrate 100 in the third direction DR3. For example, the second cover member TC2 may be moved in the opposite direction to the second direction DR2 from the side surface of the first substrate 100. As such, when the second cover member TC2 is moved in the opposite direction to the second direction DR2 from the side surface of the first substrate 100 as described above, there is an advantage that a space for coupling the cover members TC can be formed under the first substrate 100 when the tiled display apparatus TD is implemented. Accordingly, it is possible to prevent the bezel from being increased due to the space for coupling. It is, however, to be understood that the present disclosure is not limited thereto. The second cover member TC2 may be aligned with one side surface of the first substrate 100 in the third direction DR3.

Figure 31:
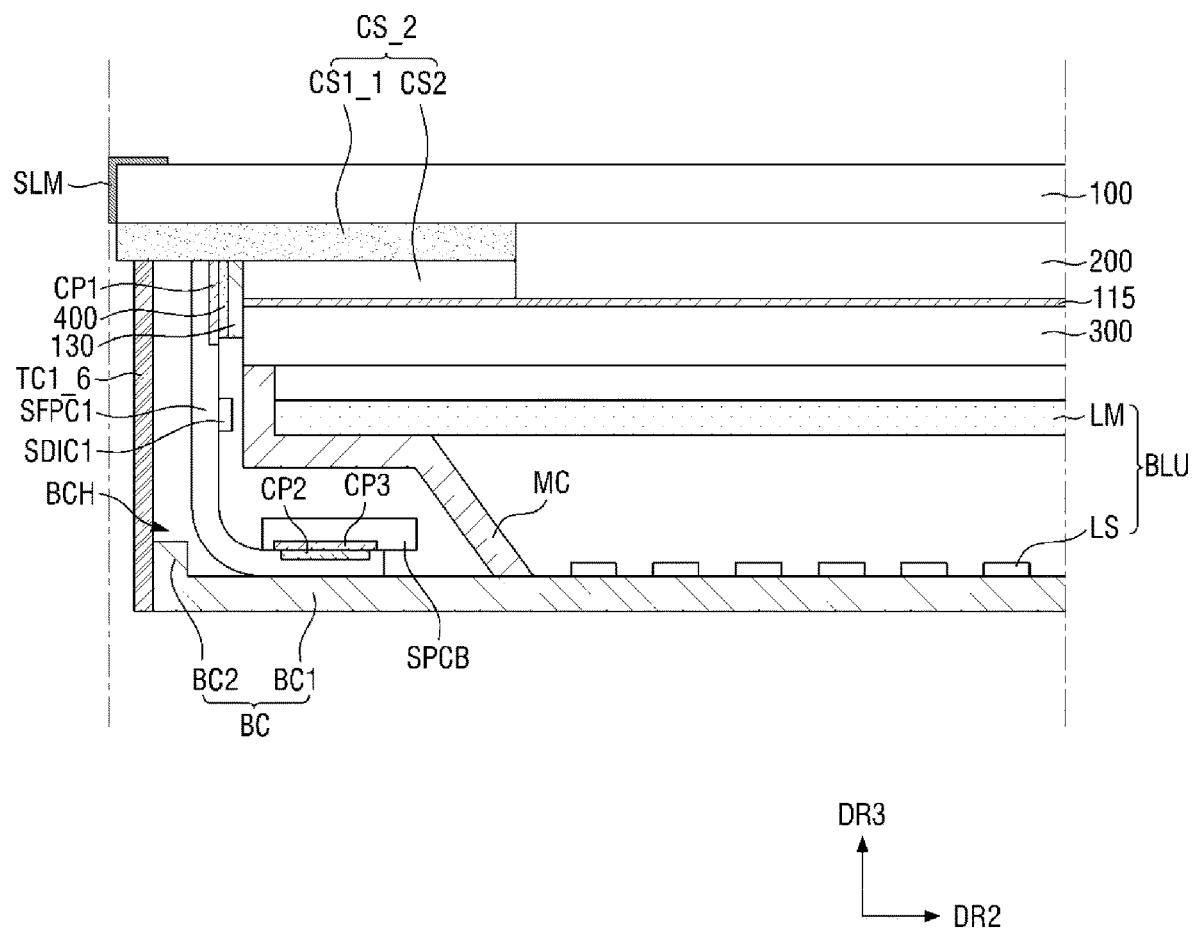
FIG. 31 is a cross-sectional view of a display device according to some example embodiments of the present disclosure of the present disclosure, taken along the line II-II' of FIG. 2.
Figure 32:
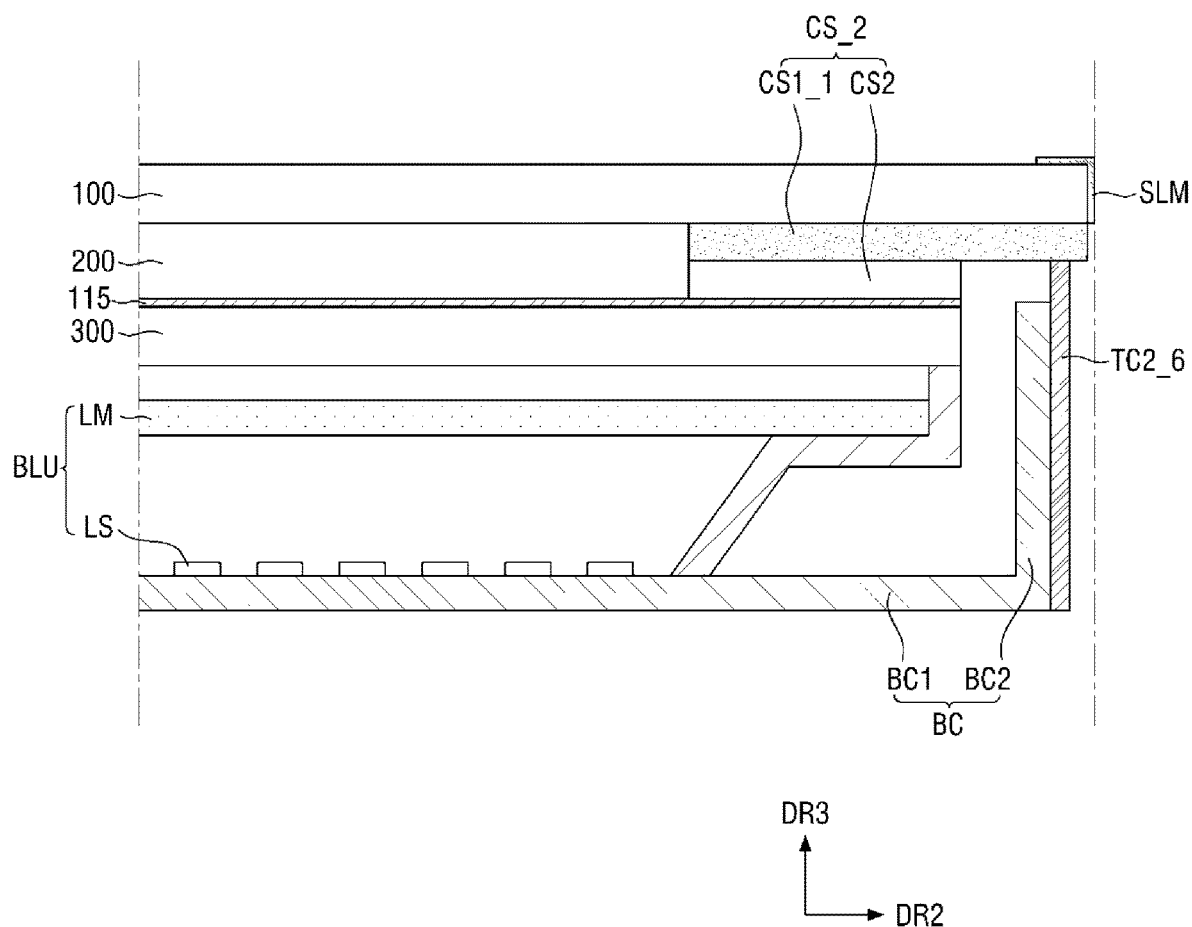
FIG. 32 is a cross-sectional view of a display device according to some example embodiments of the present disclosure, taken along the line III-III' of FIG. 2.

FIG. 31 is a cross-sectional view of a display device according to some example embodiments of the present disclosure, taken along the line II-II' of FIG. 2. FIG. 32 is a cross-sectional view of a display device according to some example embodiments, taken along the line III-III' of FIG. 2. The example embodiment of FIGS. 31 and 32 is different from the example embodiment of FIGS. 29 and 30 in that at least one of the elements positioned on the first substrate is extended beyond the second substrate. Description will focus on differences, and the redundant description will be omitted.

Referring to FIGS. 31 and 32, in a display device 1_7 according to some example embodiments, a first substrate 100 may be positioned on a second substrate 300. The first substrate 100 may be a TFT substrate, and the second substrate 300 may be a color filter substrate. The second substrate 300 may be positioned under the first substrate 100 and may recede from the first substrate 100 in the second direction DR2 by a first distance d1. At least one of the elements positioned on the first substrate 100 may be extended and positioned on the part of the first substrate 100 that protrudes from the second substrate 300. For example, the first spacer CS1_1 may be extended to the region where the first substrate 100 and the second substrate 300 do not overlap with each other. When the first spacer CS1_1 is extended to the end of the first substrate 100, the upper ends of the first cover member TC1_6 and the second cover member TC2_6 may be coupled with the first spacer CS1_1. In such case, a light-blocking member SLM may be positioned only on a part of the upper end and on the side surface of the first substrate, and the length of the first spacer CS1_1 may be different from the length of the second spacer CS2. It is, however, to be understood that the present disclosure is not limited thereto. In some example embodiments, at least one of the elements positioned on the first substrate 100 may be extended to the region where the first substrate 100 and the second substrate 300 do not overlap with each other but may not reach the end of the first substrate 100. In such case, the upper ends of the first cover member TC1_6 and the second cover member TC2_6 may be coupled and fixed to the first substrate 100 by an adhesive member.

In concluding the detailed description, those skilled in the art will appreciate that many variations and modifications can be made to the example embodiments without substantially departing from the principles of the present invention. Therefore, the disclosed example embodiments of the invention are used in a generic and descriptive sense only and not for purposes of limitation.

What is claimed is:

1. A display device comprising:
a first substrate having a first area;
a second substrate having a second area larger than the first area and positioned above the first substrate;
interconnects on the first substrate;
connection pads on a side surface of the first substrate and electrically connected to the interconnects; and
a first cover member on the side surface of the first substrate,
wherein a side surface of the second substrate protrudes from the side surface of the first substrate in a first direction, and the first cover member is located under the second substrate.

2. The display device of claim 1, wherein the first cover member comprises: a first portion extending in a second direction intersecting with the first direction; and a second portion extending in the first direction from an upper end of the first cover member, wherein the second portion is fixed to the second substrate.

3. The display device of claim 1, wherein the first cover member comprises: a first portion extending in a second direction intersecting with the first direction; and a second portion extending in an opposite direction to the first direction from an upper end of the first cover member, wherein the second portion is fixed to the second substrate.

4. The display device of claim 1, wherein the second substrate comprises:
a first region overlapping the first substrate in a second direction intersecting with the first direction; and
a second region not overlapping the first substrate in the second direction, and wherein an accommodating groove is in the second region so that an upper end of the first cover member is inserted into the accommodating groove.

5. The display device of claim 1, wherein the first cover member comprises:
a first vertical portion extending in a second direction intersecting with the first direction;
a first protruding portion protruding in the first direction; and
a first depressed portion protruding in an opposite direction to the first direction, wherein an end of the first vertical portion is fixed to the second substrate.

6. The display device of claim 5, further comprising:
a second cover member on another side surface of the first substrate and under the second substrate, wherein the second cover member comprises a second vertical portion extending in a second direction intersecting with the first direction, a second protruding portion protruding in an opposite direction to the first direction, and a second depressed portion protruding in the first direction, and wherein an end of the first vertical portion is fixed to the second substrate.

7. The display device of claim 6, wherein the first protruding portion is aligned with the second depressed portion in the first direction, and the first depressed portion is aligned with the second protruding portion in the first direction.

8. The display device of claim 1, further comprising:
a bottom cover positioned under the first substrate and comprising a bottom, a first sidewall and a second sidewall, wherein an upper end of the first cover member is fixed to a lower surface of the second substrate, and a lower end of the first cover member is fixed to the first sidewall.

9. The display device of claim 8, further comprising:
a second cover member on another side surface of the first substrate and under the second substrate, wherein an upper end of the second cover member is fixed to the lower surface of the second substrate and a lower end of the second cover member is fixed to the second sidewall, and wherein a length of the first sidewall is different from a length of the second sidewall in a second direction intersecting with the first direction.

10. The display device of claim 1, wherein the first substrate is a color filter substrate, and the second substrate is a TFT substrate, and wherein the display device further comprises:
a first spacer between the first substrate and the second substrate, and a second spacer between the first spacer and the first substrate.

11. The display device of claim 10, wherein a side surface of the first spacer is aligned with the side surface of the second substrate, and a side surface of the second spacer is aligned with the side surface of the first substrate.

12. The display device of claim 11, wherein the first spacer comprises a blue colorant.

13. The display device of claim 1, wherein the side surface of the second substrate protrudes from the side surface of the first substrate by a distance of 0.3 mm to 0.5 mm.

14. A display device comprising:
a display panel comprising a first substrate and a second substrate, each of the first substrate and the second substrate having first to fourth side surfaces; and
first to fourth cover members on the first to fourth side surfaces, respectively,
wherein the display panel comprises
interconnects on the first substrate, and
connection pads on the first side surface of the first substrate and electrically connected to the interconnects,
wherein the first side surface of the second substrate protrudes from the first side surface of the first substrate, and the first cover member is on the first side surface and under the second substrate and is spaced apart from the connection pads.

15. The display device of claim 14, wherein the second to fourth side surfaces of each of the first substrate and the second substrate are aligned with one another in a second direction intersecting with the first direction, wherein the second cover member is on the second side surface of each of the first substrate and the second substrate, wherein the third cover member is on the third side surface of each of the first substrate and the second substrate, and wherein the fourth cover member is on the fourth side surface of each of the first substrate and the second substrate.

16. The display device of claim 14, wherein the second side surface of the second substrate opposed to the first side surface of the second substrate protrudes from the first side surface of the first substrate in an opposite direction to the first direction, and wherein the second cover member is on the second side surface of the first substrate and under the second substrate.

17. The display device of claim 16, wherein the third side surface of the second substrate connecting the first side surface with the second side surface of the second substrate protrudes from the third side surface of the first substrate in a second direction intersecting with the first direction, and wherein the third cover member is on the third side surface of the first substrate and under the second substrate.

18. The display device of claim 17, wherein the fourth side surface of the second substrate opposed to the third side surface of the second substrate protrudes from the fourth side surface of the first substrate in an opposite direction to the second direction, and wherein the fourth cover member is on the fourth side surface of the first substrate and under the second substrate.

19. The display device of claim 14, wherein a side surface of the first cover member is aligned with the first side surface of the second substrate.

20. The display device of claim 14, wherein at least one of the first cover member, the second cover member, the third cover member and the fourth cover member overlaps the second substrate in a second direction intersecting the first direction.

* * * * *